United States Patent [19]
Khandros et al.

[11] Patent Number: 5,994,152
[45] Date of Patent: Nov. 30, 1999

[54] FABRICATING INTERCONNECTS AND TIPS USING SACRIFICIAL SUBSTRATES

[75] Inventors: Igor Y. Khandros, Livermore; Benjamin N. Eldridge, Danville; Gaetan L. Mathieu, Dublin, all of Calif.

[73] Assignee: FormFactor, Inc., Livermore, Calif.

[21] Appl. No.: 08/788,740

[22] Filed: Jan. 24, 1997

Related U.S. Application Data

[63] Continuation of application No. PCT/US96/08107, May 24, 1996, and a continuation-in-part of application No. 08/452,255, May 26, 1995, application No. PCT/US95/14909, Nov. 13, 1995, application No. 08/570,230, Dec. 11, 1995, Pat. No. 5,852,871, application No. 08/457,479, Jun. 1, 1995, application No. 08/526,246, Sep. 21, 1995, abandoned, application No. PCT/US95/14843, Nov. 13, 1995, application No. 08/533,584, Oct. 18, 1995, Pat. No. 5,772,451, application No. PCT/US95/14842, Nov. 13, 1995, application No. 08/554,902, Nov. 9, 1995, application No. PCT/US95/14844, Nov. 13, 1995, application No. 08/558,332, Nov. 15, 1995, Pat. No. 5,829,128, application No. PCT/US95/14885, Nov. 15, 1995, application No. 08/573,945, Dec. 18, 1995, Pat. No. 5,601,740, application No. 08/584,981, Jan. 11, 1996, Pat. No. 5,820,014, and application No. 08/602,179, Feb. 15, 1996, abandoned, said application No. 08/452,255, and application No. PCT/US95/14909, each is a continuation-in-part of application No.08/340,144, Nov. 15, 1994, and application No. PCT/US94/13373, Nov. 16, 1994, said application No. 08/340,144, and application No. PCT/US94/13373, each is a continuation-in-part of application No.08/152,812, Nov. 16, 1993, Pat. No. 5,476,211, said application No. 08/570,230, and application No. 08/457,479, each is a division of application No.08/152,812

[60] Provisional application No. 60/005,189, May 17, 1996, provisional application No. 60/012,027, Feb. 21, 1996, provisional application No. 60/012,040, Feb. 22, 1996, provisional application No. 60/012,878, Mar. 5, 1996, and provisional application No. 60/013,247, Mar. 11, 1996.

[51] Int. Cl.[6] .................................................. H01L 21/44
[52] U.S. Cl. .............................. 436/617; 438/117; 438/15
[58] Field of Search ............................... 438/117, 14, 15, 438/17, 611, 617

[56] References Cited

U.S. PATENT DOCUMENTS

| | | | |
|---|---|---|---|
| 2,429,222 | 10/1947 | Erhardt et al. | 29/885 |
| 2,923,859 | 2/1960 | Worth et al. | 217/101 |
| 3,006,067 | 10/1961 | Anderson et al. | 29/470 |

(List continued on next page.)

FOREIGN PATENT DOCUMENTS

| | | |
|---|---|---|
| 0 002 166 A2 | 5/1979 | European Pat. Off. . |
| 0396248A2 | 11/1990 | European Pat. Off. . |

(List continued on next page.)

OTHER PUBLICATIONS

International Preliminary Examination Report, International Application No. PCT/US96/08107, International Preliminary Examining Authority, Sep. 18, 1997.

(List continued on next page.)

*Primary Examiner*—Kevin M. Picardat
*Attorney, Agent, or Firm*—Gerald Linden; Daivd Larwood

[57] ABSTRACT

Interconnection elements and/or tip structures for interconnection elements may first be fabricated upon sacrificial substrates for subsequent mounting to electronic components. In this manner, the electronic components are not 'at risk' during the fabrication process. The sacrificial substrate establishes a predetermined spatial relationship between the interconnection elements which may be composite interconnection elements having a relatively soft elongate element as a core and a relatively hard (springy material) overcoat. Tip structures fabricated on sacrificial substrates may be provided with a surface texture optimized for mounting to any interconnection elements for making pressure connections to terminals of electronic components. Interconnection elements may be fabricated upon such tip structures, or may first be mounted to the electronic component and the tip structures joined to the free-ends of the interconnection elements. Tip structures formed as cantilever beams are described.

60 Claims, 10 Drawing Sheets

U.S. PATENT DOCUMENTS

| | | | |
|---|---|---|---|
| 3,047,683 | 7/1962 | Shlesinger, Jr. | 200/26 |
| 3,070,650 | 12/1962 | Stearns | 174/88 |
| 3,075,282 | 1/1963 | McConville | 29/155.55 |
| 3,202,489 | 8/1965 | Bender et al. | 29/195 |
| 3,214,563 | 10/1965 | Ford | 219/69 |
| 3,227,933 | 1/1966 | Punte et al. | 317/234 |
| 3,258,736 | 6/1966 | Crawford et al. | 339/252 |
| 3,266,137 | 8/1966 | DeMille et al. | 29/473.1 |
| 3,281,751 | 10/1966 | Blair | 339/17 |
| 3,286,340 | 11/1966 | Kritzler et al. | 29/471.1 |
| 3,296,692 | 1/1967 | Griffin | 29/472.9 |
| 3,302,067 | 1/1967 | Jackson et al. | 317/101 |
| 3,344,228 | 9/1967 | Woodland et al. | 174/107 |
| 3,368,114 | 2/1968 | Campbell et al. | 317/101 |
| 3,373,481 | 3/1968 | Lins et al. | 29/471.3 |
| 3,381,081 | 4/1968 | Schalliol | 174/68.5 |
| 3,389,457 | 6/1968 | Goldman et al. | 29/580 |
| 3,390,308 | 6/1968 | Marley | 317/100 |
| 3,392,442 | 7/1968 | Napier et al. | 29/628 |
| 3,397,451 | 8/1968 | Avedissian et al. | 29/589 |
| 3,426,252 | 2/1969 | Lepselter | 317/234 |
| 3,429,040 | 2/1969 | Miller | 29/626 |
| 3,460,238 | 8/1969 | Christy et al. | 227/111 |
| 3,467,765 | 9/1969 | Croft | 174/94 |
| 3,472,365 | 10/1969 | Tiedema | 206/56 |
| 3,474,297 | 10/1969 | Bylander | 317/101 |
| 3,487,541 | 1/1970 | Boswell | 29/626 |
| 3,495,170 | 2/1970 | Biard et al. | 324/62 |
| 3,509,270 | 4/1970 | Dube et al. | 29/625 |
| 3,517,438 | 6/1970 | Johnson et al. | 29/627 |
| 3,550,645 | 12/1970 | Keough | 140/92.2 |
| 3,555,477 | 1/1971 | Hildebrandt | 336/192 |
| 3,567,846 | 3/1971 | Brorein et al. | 174/102 |
| 3,569,610 | 3/1971 | Gardner et al. | 174/102 |
| 3,590,480 | 7/1971 | Johnson, Jr. | 29/605 |
| 3,591,839 | 7/1971 | Evans | 317/234 |
| 3,611,061 | 10/1971 | Segerson | 317/234 R |
| 3,614,832 | 10/1971 | Chance et al. | 29/626 |
| 3,616,532 | 11/1971 | Beck | 174/68.5 |
| 3,623,649 | 11/1971 | Keisling | 228/15 |
| 3,627,124 | 12/1971 | Hance | 209/45 |
| 3,636,242 | 1/1972 | Hansson | 174/128 |
| 3,672,047 | 6/1972 | Sakamoto et al. | 29/628 |
| 3,673,681 | 7/1972 | Steranko | 29/626 |
| 3,680,037 | 7/1972 | Nellis et al. | 339/61 M |
| 3,680,206 | 8/1972 | Roberts | 29/580 |
| 3,683,105 | 8/1972 | Shamash et al. | 174/68.5 |
| 3,689,991 | 9/1972 | Aird | 20/577 |
| 3,719,981 | 3/1973 | Steitz | 29/423 |
| 3,724,068 | 4/1973 | Galli | 29/626 |
| 3,753,665 | 8/1973 | McCary | 29/191.6 |
| 3,772,575 | 11/1973 | Hegarty et al. | 317/235 R |
| 3,795,037 | 3/1974 | Luttmer | 29/628 |
| 3,795,884 | 3/1974 | Kotaka | 339/17 LM |
| 3,811,186 | 5/1974 | Larnerd et al. | 29/626 |
| 3,825,353 | 7/1974 | Loro | 317/234 R |
| 3,832,632 | 8/1974 | Ardezzone | 324/158 P |
| 3,832,769 | 9/1974 | Olyphant, Jr. et al. | 29/626 |
| 3,839,727 | 10/1974 | Herdzik et al. | 357/71 |
| 3,842,189 | 10/1974 | Southgate | 174/52 S |
| 3,844,909 | 10/1974 | McCary et al. | 204/40 |
| 3,861,135 | 1/1975 | Seeger, Jr. et al. | 58/50 R |
| 3,862,790 | 1/1975 | Davies et al. | 339/17 LM |
| 3,862,791 | 1/1975 | Miller | 339/198 R |
| 3,864,728 | 2/1975 | Peltz et al. | 357/71 |
| 3,868,724 | 2/1975 | Perrino | 357/65 |
| 3,871,014 | 3/1975 | King et al. | 357/67 |
| 3,871,015 | 3/1975 | Lin et al. | 357/67 |
| 3,873,173 | 3/1975 | Anhault | 339/17 CF |
| 3,877,064 | 4/1975 | Scheingold et al. | 357/74 |
| 3,894,671 | 7/1975 | Kulicke, Jr. et al. | 228/4.5 |
| 3,900,153 | 8/1975 | Beerwerth et al. | 228/246 |
| 3,904,262 | 9/1975 | Cutchaw | 339/17 CF |
| 3,917,900 | 11/1975 | Arnaudin | 174/107 |
| 3,921,285 | 11/1975 | Krall | 29/626 |
| 3,926,360 | 12/1975 | Moister, Jr. | 228/180 |
| 3,939,559 | 2/1976 | Fendley et al. | 29/628 |
| 3,940,786 | 2/1976 | Scheingold et al. | 357/74 |
| 3,982,320 | 9/1976 | Buchoff et al. | 29/630 R |
| 3,984,166 | 10/1976 | Hutchison | 339/17 CF |
| 3,990,689 | 11/1976 | Eklund, Sr. | 269/21 |
| 3,991,463 | 11/1976 | Squitieri et al. | 29/629 |
| 4,003,621 | 1/1977 | Lamp | 339/59 M |
| 4,009,485 | 2/1977 | Koenig | 357/68 |
| 4,025,143 | 5/1977 | Rozmus | 339/278 C |
| 4,034,468 | 7/1977 | Koopman | 29/628 |
| 4,060,828 | 11/1977 | Satonaka | 357/71 |
| 4,067,104 | 1/1978 | Tracy | 29/626 |
| 4,074,342 | 2/1978 | Honn et al. | 361/411 |
| 4,080,722 | 3/1978 | Klatskin et al. | 29/580 |
| 4,132,341 | 1/1979 | Bratschun | 228/122 |
| 4,139,936 | 2/1979 | Abrams et al. | 29/624 |
| 4,142,288 | 3/1979 | Flammer | 29/628 |
| 4,149,135 | 4/1979 | Roespel et al. | 336/65 |
| 4,155,615 | 5/1979 | Zimmerman, Jr. et al. | 339/14 L |
| 4,161,692 | 7/1979 | Tarzwell | 324/158 P |
| 4,179,802 | 12/1979 | Joshi et al. | 29/628 |
| 4,189,825 | 2/1980 | Robillard et al. | 29/589 |
| 4,195,193 | 3/1980 | Grabbe et al. | 174/52 FP |
| 4,216,350 | 8/1980 | Reid | 174/68.5 |
| 4,225,900 | 9/1980 | Ciccio et al. | 361/395 |
| 4,231,154 | 11/1980 | Gazdik et al. | 29/840 |
| 4,237,607 | 12/1980 | Ohno | 29/840 |
| 4,272,140 | 6/1981 | Lychyk | 339/17 CF |
| 4,278,311 | 7/1981 | Scheingold et al. | 339/17 CF |
| 4,295,700 | 10/1981 | Sado | 339/61 M |
| 4,312,117 | 1/1982 | Robillard et al. | 29/589 |
| 4,322,778 | 3/1982 | Barbour et al. | 361/414 |
| 4,326,663 | 4/1982 | Oettel | 228/123 |
| 4,330,165 | 5/1982 | Sado | 339/59 |
| 4,332,341 | 6/1982 | Minetti | 228/180 A |
| 4,354,310 | 10/1982 | Hatton | 29/605 |
| 4,356,374 | 10/1982 | Noyori et al. | 219/121 PE |
| 4,357,062 | 11/1982 | Everett | 339/18 R |
| 4,374,457 | 2/1983 | Wiech, Jr. | 29/591 |
| 4,385,202 | 5/1983 | Spinelli et al. | 174/68.5 |
| 4,396,935 | 8/1983 | Schuck | 357/74 |
| 4,402,450 | 9/1983 | Abraham et al. | 228/180 A |
| 4,407,007 | 9/1983 | Desai et al. | 357/74 |
| 4,408,218 | 10/1983 | Grabbe | 357/70 |
| 4,410,905 | 10/1983 | Grabbe | 357/80 |
| 4,412,642 | 11/1983 | Fisher | 228/173 R |
| 4,417,392 | 11/1983 | Ibrahim et al. | 29/840 |
| 4,418,857 | 12/1983 | Ainslie et al. | 228/124 |
| 4,419,818 | 12/1983 | Grabbe | 29/832 |
| 4,422,568 | 12/1983 | Elles et al. | 228/111 |
| 4,434,347 | 2/1984 | Kurtz et al. | 219/56.22 |
| 4,442,938 | 4/1984 | Murphy | 206/329 |
| 4,442,967 | 4/1984 | van de Pas et al. | 228/158 |
| 4,447,857 | 5/1984 | Marks et al. | 361/395 |
| 4,453,176 | 6/1984 | Chance et al. | 357/51 |
| 4,462,534 | 7/1984 | Bitaillou et al. | 228/180 A |
| 4,472,762 | 9/1984 | Spinelli et al. | 361/386 |
| 4,508,405 | 4/1985 | Damon et al. | 339/75 MP |
| 4,509,099 | 4/1985 | Takamatsu et al. | 361/413 |
| 4,513,355 | 4/1985 | Schroeder et al. | 361/403 |
| 4,514,750 | 4/1985 | Adams | 357/70 |
| 4,520,561 | 6/1985 | Brown | 29/840 |
| 4,522,893 | 6/1985 | Bohlen et al. | 438/611 |
| 4,525,383 | 6/1985 | Saito | 427/89 |
| 4,528,500 | 7/1985 | Lightbody et al. | 324/73 PC |
| 4,532,152 | 7/1985 | Elarde | 427/96 |

| Patent | Date | Inventor | Class |
|---|---|---|---|
| 4,537,808 | 8/1985 | Yamamoto et al. | 428/36 |
| 4,542,438 | 9/1985 | Yamamoto | 361/403 |
| 4,545,610 | 10/1985 | Lakritz et al. | 29/589 |
| 4,546,406 | 10/1985 | Spinelli et al. | 361/386 |
| 4,547,833 | 10/1985 | Sharp | 361/386 |
| 4,551,746 | 11/1985 | Gilbert | 357/74 |
| 4,553,192 | 11/1985 | Babuka et al. | 361/395 |
| 4,574,470 | 3/1986 | Burt | 29/590 |
| 4,581,291 | 4/1986 | Bongianni | 428/381 |
| 4,595,794 | 6/1986 | Wasserman | 174/138 |
| 4,597,522 | 7/1986 | Kobayashi | 228/179 |
| 4,597,617 | 7/1986 | Enochs | 339/17 CF |
| 4,600,138 | 7/1986 | Hill | 228/179 |
| 4,604,644 | 8/1986 | Beckham et al. | 357/80 |
| 4,615,573 | 10/1986 | White et al. | 339/17 M |
| 4,627,151 | 12/1986 | Mulholland et al. | 29/569 R |
| 4,628,406 | 12/1986 | Smith et al. | 361/386 |
| 4,628,410 | 12/1986 | Goodman et al. | 361/413 |
| 4,634,199 | 1/1987 | Anhalt et al. | 339/17 M |
| 4,640,499 | 2/1987 | Hemler et al. | 267/160 |
| 4,641,176 | 2/1987 | Keryhuel et al. | 357/74 |
| 4,641,426 | 2/1987 | Hartman et al. | 29/839 |
| 4,642,889 | 2/1987 | Grabbe | 29/840 |
| 4,646,435 | 3/1987 | Grassauer | 29/840 |
| 4,647,126 | 3/1987 | Sobota | 339/17 CF |
| 4,647,959 | 3/1987 | Smith | 357/74 |
| 4,649,415 | 3/1987 | Herbert | 357/74 |
| 4,659,437 | 4/1987 | Shiba et al. | 204/28 |
| 4,661,192 | 4/1987 | McShane | 156/292 |
| 4,664,309 | 5/1987 | Allen et al. | 228/180.2 |
| 4,667,219 | 5/1987 | Lee et al. | 357/68 |
| 4,670,770 | 6/1987 | Tai | 357/60 |
| 4,673,967 | 6/1987 | Hingorany | 357/70 |
| 4,674,671 | 6/1987 | Fister et al. | 228/111 |
| 4,677,458 | 6/1987 | Morris | 357/74 |
| 4,681,654 | 7/1987 | Clementi et al. | 156/630 |
| 4,685,998 | 8/1987 | Quinn et al. | 156/633 |
| 4,688,074 | 8/1987 | Iinuma | 357/79 |
| 4,695,870 | 9/1987 | Patraw | 357/74 |
| 4,695,872 | 9/1987 | Chatterjee | 357/75 |
| 4,700,276 | 10/1987 | Freyman et al. | 361/403 |
| 4,700,473 | 10/1987 | Freyman et al. | 29/846 |
| 4,703,393 | 10/1987 | Yamamoto et al. | 361/405 |
| 4,705,205 | 11/1987 | Allen et al. | 228/180.2 |
| 4,708,885 | 11/1987 | Saito et al. | 427/58 |
| 4,709,468 | 12/1987 | Wilson | 437/209 |
| 4,710,798 | 12/1987 | Marcantonio | 357/80 |
| 4,716,049 | 12/1987 | Patraw | 427/96 |
| 4,721,993 | 1/1988 | Walter | 357/70 |
| 4,724,383 | 2/1988 | Hart | 324/158 F |
| 4,732,313 | 3/1988 | Kobayashi et al. | 228/179 |
| 4,739,125 | 4/1988 | Watanabe et al. | 174/52 FP |
| 4,740,410 | 4/1988 | Muller et al. | 428/133 |
| 4,746,300 | 5/1988 | Thevenin | 439/82 |
| 4,750,089 | 6/1988 | Derryberry et al. | 361/388 |
| 4,751,199 | 6/1988 | Phy | 437/209 |
| 4,751,482 | 6/1988 | Fukuta et al. | 333/247 |
| 4,754,316 | 6/1988 | Reid | 357/68 |
| 4,757,256 | 7/1988 | Whann et al. | 324/158 P |
| 4,764,804 | 8/1988 | Sahara et al. | 357/81 |
| 4,764,848 | 8/1988 | Simpson | 361/408 |
| 4,767,344 | 8/1988 | Noschese | 439/83 |
| 4,772,936 | 9/1988 | Reding et al. | 357/80 |
| 4,777,564 | 10/1988 | Derfiny et al. | 361/405 |
| 4,783,719 | 11/1988 | Jamison et al. | 361/398 |
| 4,784,872 | 11/1988 | Moeller et al. | 427/96 |
| 4,784,972 | 11/1988 | Hatada | 438/611 |
| 4,793,814 | 12/1988 | Zifcak et al. | 439/66 |
| 4,796,078 | 1/1989 | Phelps, Jr. et al. | 357/68 |
| 4,807,021 | 2/1989 | Okumura | 357/75 |
| 4,811,082 | 3/1989 | Jacobs et al. | 357/80 |
| 4,814,295 | 3/1989 | Mehta | 437/209 |
| 4,816,426 | 3/1989 | Bridges et al. | 437/207 |
| 4,818,728 | 4/1989 | Rai et al. | 437/209 |
| 4,818,823 | 4/1989 | Bradley | 174/68.5 |
| 4,821,148 | 4/1989 | Kobayashi et al. | 361/392 |
| 4,827,611 | 5/1989 | Pai et al. | 29/843 |
| 4,829,153 | 5/1989 | Correy | 219/130.4 |
| 4,837,622 | 6/1989 | Whann et al. | 324/158 P |
| 4,842,184 | 6/1989 | Miller | 228/180.1 |
| 4,855,867 | 8/1989 | Gadzik | 361/306 |
| 4,857,482 | 8/1989 | Saito et al. | 437/209 |
| 4,858,819 | 8/1989 | Hill et al. | 228/179 |
| 4,860,433 | 8/1989 | Miura | 29/605 |
| 4,861,452 | 8/1989 | Stierman | 204/297 W |
| 4,868,638 | 9/1989 | Hirata et al. | 357/72 |
| 4,873,123 | 10/1989 | Canestaro et al. | 427/96 |
| 4,874,476 | 10/1989 | Stierman et al. | 204/15 |
| 4,874,721 | 10/1989 | Kimura et al. | 437/209 |
| 4,874,722 | 10/1989 | Bednarz | 437/209 |
| 4,877,173 | 10/1989 | Fujimoto et al. | 228/1.1 |
| 4,878,098 | 10/1989 | Saito et al. | 357/68 |
| 4,878,611 | 11/1989 | Lo Vasco et al. | 228/180.2 |
| 4,878,846 | 11/1989 | Schroeder | 439/65 |
| 4,884,122 | 11/1989 | Eichelberger et al. | 357/71 |
| 4,887,148 | 12/1989 | Mu | 357/74 |
| 4,890,194 | 12/1989 | Derryberry | 361/386 |
| 4,893,172 | 1/1990 | Matsumoto et al. | 357/79 |
| 4,899,106 | 2/1990 | Ogura | 324/158 F |
| 4,902,606 | 2/1990 | Patraw | 430/314 |
| 4,903,120 | 2/1990 | Beene et al. | 357/74 |
| 4,903,889 | 2/1990 | Svendsen et al. | 228/180.2 |
| 4,907,734 | 3/1990 | Conru et al. | 228/123 |
| 4,914,814 | 4/1990 | Behun et al. | 29/843 |
| 4,918,032 | 4/1990 | Jain et al. | 437/228 |
| 4,918,811 | 4/1990 | Eichelberger | 29/840 |
| 4,922,376 | 5/1990 | Pommer et al. | 361/386 |
| 4,924,353 | 5/1990 | Patraw | 361/400 |
| 4,926,241 | 5/1990 | Carey | 357/75 |
| 4,931,149 | 6/1990 | Stierman et al. | 204/15 |
| 4,932,902 | 6/1990 | Crane, Jr. | 439/627 |
| 4,937,203 | 6/1990 | Eichelberger et al. | 437/51 |
| 4,941,033 | 7/1990 | Kishida | 357/75 |
| 4,942,140 | 7/1990 | Ootsuki et al. | 437/211 |
| 4,943,845 | 7/1990 | Wilby | 357/74 |
| 4,953,834 | 9/1990 | Ebert et al. | 267/160 |
| 4,954,878 | 9/1990 | Fox et al. | 357/81 |
| 4,955,523 | 9/1990 | Calomagno et al. | 228/179 |
| 4,956,749 | 9/1990 | Chang | 361/414 |
| 4,967,261 | 10/1990 | Niki et al. | 357/70 |
| 4,970,570 | 11/1990 | Agarwala et al. | 357/76 |
| 4,975,079 | 12/1990 | Beaman et al. | 439/482 |
| 4,982,264 | 1/1991 | Cragon et al. | 357/75 |
| 4,983,907 | 1/1991 | Crowley | 324/158 P |
| 4,989,069 | 1/1991 | Hawkins | 357/74 |
| 4,998,885 | 3/1991 | Beaman | 439/66 |
| 5,006,673 | 4/1991 | Freyman et al. | 174/255 |
| 5,006,688 | 4/1991 | Cross | 219/130.4 |
| 5,007,576 | 4/1991 | Congleton et al. | 228/103 |
| 5,012,187 | 4/1991 | Littlebury | 324/158 P |
| 5,014,111 | 5/1991 | Tsuda et al. | 357/68 |
| 5,024,372 | 6/1991 | Altman et al. | 228/248 |
| 5,024,746 | 6/1991 | Stierman et al. | 204/297 W |
| 5,025,306 | 6/1991 | Johnson et al. | 357/75 |
| 5,029,325 | 7/1991 | Higgins, III | 357/80 |
| 5,037,023 | 8/1991 | Akiyama et al. | 228/102 |
| 5,041,901 | 8/1991 | Kitano et al. | 357/70 |
| 5,045,410 | 9/1991 | Hiesbock et al. | 428/644 |
| 5,045,921 | 9/1991 | Lin et al. | 357/74 |
| 5,045,975 | 9/1991 | Cray et al. | 361/412 |
| 5,047,830 | 9/1991 | Grabbe | 357/68 |
| 5,053,922 | 10/1991 | Matta et al. | 361/386 |
| 5,055,780 | 10/1991 | Takagi et al. | 324/158 F |
| 5,057,461 | 10/1991 | Fritz | 437/220 |

| Patent No. | Date | Inventor | Class |
|---|---|---|---|
| 5,059,143 | 10/1991 | Grabbe | 439/886 |
| 5,059,557 | 10/1991 | Cragon et al. | 437/208 |
| 5,060,843 | 10/1991 | Yasuzato et al. | 228/179 |
| 5,065,281 | 11/1991 | Hernandez et al. | 361/388 |
| 5,066,907 | 11/1991 | Tarzwell et al. | 324/158 P |
| 5,067,007 | 11/1991 | Kanji | 357/74 |
| 5,071,359 | 12/1991 | Arnio et al. | 439/91 |
| 5,077,633 | 12/1991 | Freyman et al. | 361/403 |
| 5,083,697 | 1/1992 | Difrancesco | 230/116 |
| 5,086,337 | 2/1992 | Noro et al. | 357/79 |
| 5,088,007 | 2/1992 | Missele | 361/386 |
| 5,090,119 | 2/1992 | Tsuda et al. | 29/843 |
| 5,095,187 | 3/1992 | Gliga | 219/68 |
| 5,097,100 | 3/1992 | Jackson | 174/94 R |
| 5,106,784 | 4/1992 | Bednarz | 437/214 |
| 5,110,032 | 5/1992 | Akiyama et al. | 228/102 |
| 5,118,027 | 6/1992 | Braun et al. | 228/180.2 |
| 5,123,850 | 6/1992 | Elder et al. | 439/67 |
| 5,127,570 | 7/1992 | Steitz et al. | 228/103 |
| 5,128,612 | 7/1992 | Aton et al. | 324/158 |
| 5,129,143 | 7/1992 | Wei et al. | 29/885 |
| 5,130,779 | 7/1992 | Agarwala et al. | 357/67 |
| 5,130,783 | 7/1992 | McLellan | 357/74 |
| 5,131,852 | 7/1992 | Grabbe et al. | 439/71 |
| 5,134,462 | 7/1992 | Freyman et al. | 357/74 |
| 5,136,366 | 8/1992 | Worp et al. | 357/72 |
| 5,136,367 | 8/1992 | Chiu | 357/74 |
| 5,147,084 | 9/1992 | Behun et al. | 228/56.3 |
| 5,148,103 | 9/1992 | Pasiecznik, Jr. | 324/158 P |
| 5,148,265 | 9/1992 | Khandros et al. | 357/80 |
| 5,148,266 | 9/1992 | Khandros et al. | 357/80 |
| 5,148,968 | 9/1992 | Schmidt et al. | 228/180.2 |
| 5,152,695 | 10/1992 | Grabbe et al. | 439/71 |
| 5,154,341 | 10/1992 | Melton et al. | 228/180.2 |
| 5,157,325 | 10/1992 | Murphy | 324/158 F |
| 5,163,835 | 11/1992 | Morlion et al. | 439/67 |
| 5,172,851 | 12/1992 | Matsushita et al. | 228/179 |
| 5,173,055 | 12/1992 | Grabbe | 439/66 |
| 5,180,977 | 1/1993 | Huff | 324/158 P |
| 5,185,073 | 2/1993 | Bindra et al. | 205/104 |
| 5,187,020 | 2/1993 | Kwon et al. | 428/601 |
| 5,189,507 | 2/1993 | Carlomagno et al. | 257/777 |
| 5,192,018 | 3/1993 | Terakado et al. | 228/179 |
| 5,192,681 | 3/1993 | Chiu | 437/217 |
| 5,196,268 | 3/1993 | Fritz | 428/458 |
| 5,198,153 | 3/1993 | Angelopoulos et al. | 252/500 |
| 5,200,112 | 4/1993 | Angelopoulos et al. | 252/500 |
| 5,201,454 | 4/1993 | Alfaro et al. | 228/110 |
| 5,202,061 | 4/1993 | Angelopoulos et al. | 252/500 |
| 5,210,939 | 5/1993 | Mallik et al. | 29/840 |
| 5,214,563 | 5/1993 | Estes | 361/386 |
| 5,217,597 | 6/1993 | Moore et al. | 205/123 |
| 5,218,292 | 6/1993 | Goto | 324/158 F |
| 5,221,815 | 6/1993 | Bostock et al. | 174/84 R |
| 5,227,662 | 7/1993 | Ohno et al. | 257/676 |
| 5,228,862 | 7/1993 | Baumberger | 439/66 |
| 5,230,632 | 7/1993 | Baumberger et al. | 439/66 |
| 5,236,118 | 8/1993 | Bower et al. | 228/193 |
| 5,237,203 | 8/1993 | Massaron | 257/688 |
| 5,239,199 | 8/1993 | Chiu | 257/706 |
| 5,239,447 | 8/1993 | Cotues et al. | 361/744 |
| 5,241,133 | 8/1993 | Mullen, III | 174/52.4 |
| 5,246,159 | 9/1993 | Kitamura | 228/179 |
| 5,258,097 | 11/1993 | Mastrangelo | 156/644 |
| 5,258,330 | 11/1993 | Khandros et al. | 437/209 |
| 5,263,246 | 11/1993 | Aoki | 29/843 |
| 5,266,912 | 11/1993 | Kledzik | 333/247 |
| 5,278,442 | 1/1994 | Prinz et al. | 257/417 |
| 5,282,312 | 2/1994 | DiStefano et al. | 29/830 |
| 5,283,104 | 2/1994 | Aoude et al. | 428/195 |
| 5,285,949 | 2/1994 | Oikawa et al. | 228/179.1 |
| 5,288,007 | 2/1994 | Interrante et al. | 228/119 |
| 5,289,346 | 2/1994 | Carey et al. | 361/777 |
| 5,293,073 | 3/1994 | Ono | 257/740 |
| 5,294,039 | 3/1994 | Pai et al. | 228/180.22 |
| 5,299,939 | 4/1994 | Walker et al. | 439/74 |
| 5,302,891 | 4/1994 | Wood et al. | 324/158 F |
| 5,306,670 | 4/1994 | Mowatt | 437/209 |
| 5,308,797 | 5/1994 | Kee | 437/209 |
| 5,309,324 | 5/1994 | Hernandez et al. | 361/734 |
| 5,310,702 | 5/1994 | Yoshida et al. | 437/211 |
| 5,312,456 | 5/1994 | Reed et al. | 411/456 |
| 5,313,368 | 5/1994 | Volz et al. | 361/774 |
| 5,316,204 | 5/1994 | Takehashi et al. | 228/179.1 |
| 5,317,479 | 5/1994 | Pai et al. | 361/773 |
| 5,321,277 | 6/1994 | Sparks et al. | 257/48 |
| 5,326,643 | 7/1994 | Adamopoulos et al. | 428/472.2 |
| 5,327,327 | 7/1994 | Frew et al. | 361/784 |
| 5,331,203 | 7/1994 | Wojnarowksi et al. | 257/698 |
| 5,337,475 | 8/1994 | Aoude et al. | 29/852 |
| 5,338,705 | 8/1994 | Harris et al. | 437/217 |
| 5,339,027 | 8/1994 | Woith et al. | 324/754 |
| 5,346,861 | 9/1994 | Khandros et al. | 437/209 |
| 5,347,159 | 9/1994 | Khandros et al. | 257/692 |
| 5,347,162 | 9/1994 | Pasch | 257/773 |
| 5,350,947 | 9/1994 | Takekawa et al. | 257/702 |
| 5,359,493 | 10/1994 | Chiu | 361/719 |
| 5,366,380 | 11/1994 | Reymond | 439/66 |
| 5,366,589 | 11/1994 | Chang | 156/657 |
| 5,367,764 | 11/1994 | Distefano | 29/830 |
| 5,373,627 | 12/1994 | Grebe | 29/841 |
| 5,378,982 | 1/1995 | Feigenbaum | 324/770 |
| 5,379,191 | 1/1995 | Carey et al. | 361/777 |
| 5,381,848 | 1/1995 | Trabucco | 164/102 |
| 5,382,898 | 1/1995 | Subramanian | 324/754 |
| 5,386,344 | 1/1995 | Beaman et al. | 361/785 |
| 5,388,327 | 2/1995 | Trabucco | 29/830 |
| 5,390,844 | 2/1995 | Distefano et al. | 228/120.21 |
| 5,393,375 | 2/1995 | MacDonald et al. | 156/643 |
| 5,397,245 | 3/1995 | Roebuck et al. | 439/264 |
| 5,398,863 | 3/1995 | Gube et al. | 228/106 |
| 5,399,982 | 3/1995 | Driller et al. | 324/754 |
| 5,414,298 | 5/1995 | Grube et al. | 257/690 |
| 5,414,299 | 5/1995 | Wang et al. | 257/702 |
| 5,422,574 | 6/1995 | Kister | 324/754 |
| 5,424,652 | 6/1995 | Hembree et al. | 324/765 |
| 5,432,677 | 7/1995 | Mowatt | 361/719 |
| 5,435,482 | 7/1995 | Variot et al. | 228/254 |
| 5,442,282 | 8/1995 | Rostoker et al. | 324/158.1 |
| 5,448,106 | 9/1995 | Fujitsu | 257/668 |
| 5,453,583 | 9/1995 | Rostoker et al. | 174/267 |
| 5,455,390 | 10/1995 | DiStefano et al. | 174/262 |
| 5,471,151 | 11/1995 | DiFrancesco | 324/757 |
| 5,476,211 | 12/1995 | Khandros | 228/180.5 |
| 5,477,611 | 12/1995 | Sweis et al. | 29/840 |
| 5,481,241 | 1/1996 | Caddock, Jr. | 338/51 |
| 5,489,749 | 2/1996 | DiStefano et al. | 174/261 |
| 5,491,302 | 2/1996 | DiStefano et al. | 114/260 |
| 5,495,667 | 3/1996 | Farnworth et al. | 438/117 |
| 5,518,964 | 5/1996 | DiStefano et al. | 437/209 |
| 5,525,545 | 6/1996 | Grube et al. | 437/209 |
| 5,536,909 | 7/1996 | DiStefano et al. | 174/261 |
| 5,548,091 | 8/1996 | DiStefano et al. | 174/260 |
| 5,557,501 | 9/1996 | DiStefano et al. | 361/704 |
| 5,558,321 | 9/1996 | DiStefano et al. | 174/264 |
| 5,558,928 | 9/1996 | DiStefano et al. | 428/209 |
| 5,569,272 | 10/1996 | Reed et al. | 606/151 |
| 5,570,504 | 11/1996 | DiStefano et al. | 29/830 |
| 5,590,460 | 1/1997 | DiStefano et al. | 29/830 |
| 5,597,470 | 1/1997 | Karavakis et al. | 205/118 |
| 5,601,740 | 2/1997 | Eldridge et al. | 219/130.4 |

FOREIGN PATENT DOCUMENTS

0544305A2  6/1993  European Pat. Off. .

| | | |
|---|---|---|
| 0 593 966 A1 | 4/1994 | European Pat. Off. . |
| 1026876 | 3/1958 | Germany . |
| 2232794 | 1/1973 | Germany . |
| 25 08 702 A1 | 9/1976 | Germany . |
| 31 29 568 A1 | 4/1982 | Germany . |
| 54-146581 | 11/1979 | Japan . |
| 56-26446 | 3/1981 | Japan ................................. 437/209 |
| 57-152137 | 9/1982 | Japan ................................. 437/209 |
| 58-9330 | 1/1983 | Japan ...................................... 438/8 |
| 59-061952 | 4/1984 | Japan . |
| 59-088860 | 5/1984 | Japan . |
| 60-085545 | 5/1985 | Japan . |
| 61-051838 | 3/1986 | Japan . |
| 61-144034 | 7/1986 | Japan . |
| 62-250650 | 10/1987 | Japan . |
| 3-142847 | 10/1989 | Japan . |
| 2-105560 | 4/1990 | Japan . |
| 63-221924 | 8/1990 | Japan . |
| 2-181958 | 9/1990 | Japan . |
| 3-138969 | 6/1991 | Japan . |
| 3-225946 | 10/1991 | Japan . |
| 03268329 | 11/1991 | Japan . |
| 3-279370 | 9/1992 | Japan . |
| 5-102280 | 4/1993 | Japan . |
| 1003-396 | 2/1980 | U.S.S.R. . |
| 2167228 | 5/1985 | United Kingdom . |
| WO 91/12706 | 8/1991 | WIPO . |
| WO 94/03036 | 2/1994 | WIPO .......................... H05K 3/36 |
| PCT/US95/ 07901 | 6/1995 | WIPO . |
| PCT/US95/ 09201 | 7/1995 | WIPO . |
| PCT/US95/ 11933 | 9/1995 | WIPO . |
| PCT/US96/ 06228 | 5/1996 | WIPO . |

OTHER PUBLICATIONS

Reliability of μBGA Packaging Technology, Faraji, et al.
Bumped Flex on Chip: A Novel Approach to High Density Chip Packaging, DiStefano.
Flex on Chip for High Density Chip Packaging, Fjelstad and DiStefano.
Performance of a Novel Laminated Substrate for MCM Application, Martinez, et al.
A New Option for meeting the Challenge of Known Good Die, DiStefano, et al.
Novel Uses of Flexible Circuit Technology in High Performance Electronic Applications, DiStefano and Fjelstad.
Multilayer Flexible Circuit Technology for High Performance Electronics, DiStefano, et al.
Plating Micro Bonding used for Tape Carrier Package, Ando, et al., NIST, VLSI Packaging Workshop, Oct. 11–13, 1993, one page.
MCM–to–Printed Wiring Board (Second Level) Connection Technology Options, Knight, pp. 487–523.
*IBM Technical Disclosure Bulletin*, vol. 21, No. 8, Jan. Text Probe Contact Grid Translator Board.
*IBM Technical Disclosure Bulletin*, vol. 21, No. 4, Sep. 1978 Automatic Test Equipment Translator Board.
*IBM Technical Disclosure Bulletin*, vol. 17, No. 2, Jul. 1974 Multipoint Test Probe for Printed Cards.
Elastomeric Connector for MCM and Test Applications, Walker et al., ICEMM Proceedings, 1993, pp. 341–346.
*Electronic Materials and Processes Handbook*, Harper and Sampson, Second Edition, McGraw Hill, Inc., 1993, pp. 5.1–5.69.
*Ney Contact Manual*, Electrical Contacts for Low Energy Uses, Kenneth E. Pitney, Jan., 1973.
*Nickel Plating*, by Robert Brugger, Robert Draper Ltd. (UK), 1970.
*Printed Circuits in Space Technology*, Albert E. Linden, Prentice–Hall, Inc., 1962.
Copper Corrosion with and without Inhibitors, Brusic, et al., J. Electrochemical Society, vol. 138, pp. 2253–2259, No. 8, Aug. 1991.
Electroplating Technology, Duffy, Noyes Data Corporation, 1981.

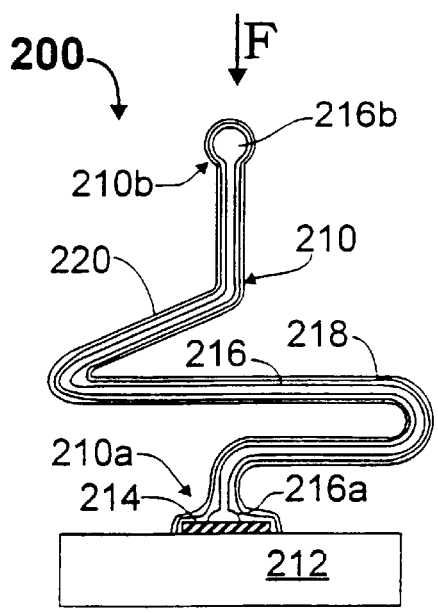
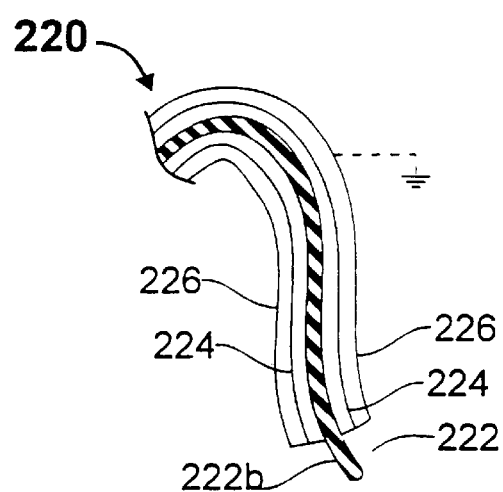
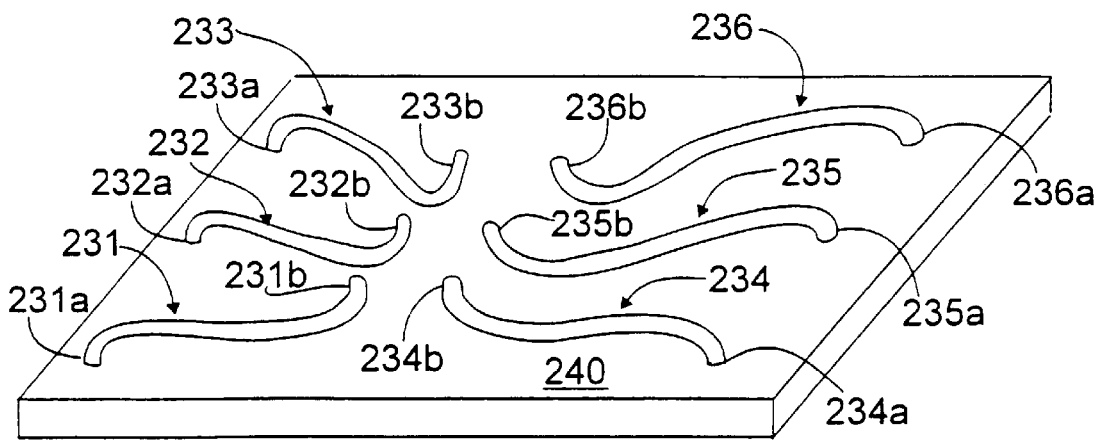

FABRICATING INTERCONNECTS AND TIPS USING SACRIFICIAL SUBSTRATES

CROSS-REFERENCE TO RELATED APPLICATIONS

This patent application is a continuation of PCT International application Serial No. US96/08107 which was filed on May 24, 1996 and designated the United States. This patent application is based on Provisional U.S. application Ser. No. 60/005,189 which was filed on May 17, 1996.

This patent application is a continuation-in-part of commonly-owned, U.S. patent application Ser. No. 08/452,255 (hereinafter "PARENT CASE") filed 26 May 1995 and its counterpart PCT patent application number PCT/US95/14909 filed 13 Nov. 1995, both of which are continuations-in-part of commonly-owned, U.S. patent application Ser. No. 08/340,144 filed 15 Nov. 1994 and its counterpart PCT patent application number PCT/US94/13373 filed 16 Nov. 1994 (published 26 May 1995 as WO 95/14314), both of which are continuations-in-part of commonly-owned, U.S. patent application Ser. No. 08/152,812 filed 16 Nov. 1993 (now U.S. Pat. No. 5,476,211, 19 Dec. 1995), all of which are incorporated by reference herein.

This patent application is also a continuation-in-part of U.S. application Ser. No. 08/570,230 which was filed on Dec. 11, 1995, now U.S. Pat. No. 5,852,871,and U.S. application Ser. No. 08/457,479 which was filed on Jun. 1, 1995, both of which are divisionals of U.S. application Ser. No. 08/152,812 which was filed on Nov. 16, 1993 (now U.S. Pat. No. 5,476,211 issued on Dec. 19, 1995).

This patent application is also a continuation-in-part of the following commonly-owned, U.S. patent application Ser. Nos.:

08/526,246 filed 21 Sep. 1995, now abandoned; (PCT/US95/14843, 13 Nov. 1995);
08/533,584 filed 18 Oct. 1995, U.S. Pat. No. 5,772,451; (PCT/US95/14842, 13 Nov. 1995);
08/554,902 filed 09 Nov. 1995; (PCT/US95/14844, 13 Nov. 1995);
08/558,332 filed 15 Nov. 1995, U.S. Pat. No. 5,829,128; (PCT/US95/14885, 13 Nov. 1995);
08/573,945 filed 18 Dec. 1995; U.S. Pat. No. 5,601,740;
08/584,981 filed 11 Jan. 1996; U.S. Pat. No. 5,520,014;
08/602,179 filed 15 Feb. 1996; now abandoned;
60/012,027 filed 21 Feb. 1996;
60/012,040 filed 22 Feb. 1996;
60/012,878 filed 05 Mar. 1996;
60/013,247 filed 11 Mar. 1996;
all of which, except for the provisional cases, are continuations-in-part of the aforementioned PARENT CASE, and all of which are incorporated by reference herein.

TECHNICAL FIELD OF THE INVENTION

The invention relates to the fabrication of electrical interconnection (contact) elements and, more particularly, to contact elements which are resilient (springy) contact elements suitable for effecting pressure connections between electronic components.

BACKGROUND OF THE INVENTION

Generally, interconnections between electronic components can be classified into the two broad categories of "relatively permanent" and "readily demountable".

An example of a "relatively permanent" connection is a solder joint. Once two electronic components are soldered to one another, a process of unsoldering must be used to separate the components. A wire bond, such as between a semiconductor die and inner leads of a semiconductor package (or inner ends of leadframe fingers) is another example of a "relatively permanent" connection.

An example of a "readily demountable" connection is rigid pins of one electronic component being received by resilient socket elements of another electronic component. The socket elements exert a contact force (pressure) on the pins in an amount sufficient to ensure a reliable electrical connection therebetween. Interconnection elements intended to make pressure contact with an electronic component are referred to herein as "springs" or "spring elements" or "spring contacts".

Prior art techniques for making spring elements generally involve stamping (punching) or etching a "monolithic" spring material, such as phosphor bronze or beryllium copper or steel or a nickel-iron-cobalt (e.g., kovar) alloy, to form individual spring elements, shaping the spring elements to have a spring shape (e.g., arcuate, etc.), optionally plating the spring elements with a good contact material (e.g., a noble metal such as gold, which will exhibit low contact resistance when contacting a like material), and molding a plurality of such shaped, plated spring elements into a linear, a peripheral or an array pattern. When plating gold onto the aforementioned materials, sometimes a thin (for example, 30–50 microinches) barrier layer of nickel is appropriate.

Generally, a certain minimum contact force is desired to effect reliable pressure contact to electronic components (e.g., to terminals on electronic components). For example, a contact (load) force of approximately 15 grams (including as little as 2 grams or less and as much as 150 grams or more, per contact) may be desired to ensure that a reliable electrical connection is made to a terminal of an electronic component which may be contaminated with films on its surface, or which has corrosion or oxidation products on its surface. The minimum contact force required of each spring element typically demands either that the yield strength of the spring material or that the size of the spring element are increased. However, generally, the higher the yield strength of a material, the more difficult it will be to work with (e.g., punch, bend, etc.). And the desire to make springs smaller essentially rules out making them larger in cross-section to achieve greater contact forces.

The PARENT CASE (U.S. patent application Ser. No. 08/452,255) describes the fabrication of resilient contact structures (spring elements) as composite interconnection elements by mounting a free-standing wire stem (elongate element) on a terminal of an electronic component, shaping the wire stem, and overcoating the free-standing wire stem to impart the desired resiliency to the resulting free-standing spring element. In the case of electronic components which are delicate and/or expensive, faulty fabrication of a composite interconnection element directly on the surface of the electronic component can require, at best, reworking the faulty interconnection element(s) or, at worst, discarding the electronic component. As mentioned in the PARENT CASE, composite interconnection elements can be fabricated (e.g., bond, shape, overcoat) on sacrificial substrates, then either singulated therefrom or gang-transferred (mounted en masse) to an electronic component.

BRIEF DESCRIPTION (SUMMARY) OF THE INVENTION

It is an object of the present invention to provide an improved technique for fabricating contact elements, especially composite interconnection elements.

It is another object of the invention to provide a technique for fabricating interconnection elements for electronic components, especially microelectronic components.

It is another object of the invention to provide resilient contact structures (interconnection elements) that are suitable for making pressure contact to electronic components.

It is another object of the invention to provide a technique for securely anchoring interconnection elements to electronic components.

It is another object of the invention to provide a technique for manufacturing interconnection elements having controlled impedance.

According to the invention, techniques are disclosed for fabricating interconnection elements, particularly spring elements, more particularly composite interconnection elements, and for mounting the interconnection elements to electronic components. The disclosed techniques generally involve mounting an elongate element to a sacrificial substrate, shaping the elongate element to have a spring shape (unless the elongate element already has a desired spring shape) and, in the case of composite interconnection elements, mounted these "pre-fabricated" spring elements to electronic components. The interconnection elements can be mounted, en masse, to the electronic component, in which case the process of fabricating the interconnection elements on the sacrificial substrate has pre-determined their spacing. In the case of removing the interconnection elements from the sacrificial substrate prior to mounting them on an electronic component, their final spacing must be controlled during the mounting process. The disclosed techniques overcome problems associated with successfully fabricating spring contacts directly on various electronic components, such as semiconductor devices.

In an embodiment of the invention, a "composite" interconnection element is fabricated by mounting an elongate element ("core element") to a sacrificial substrate, shaping the core element to have a spring shape, and overcoating the elongate element to enhance the physical (e.g., spring) characteristics of the resulting composite interconnection element.

According to an aspect of the invention, the interconnection elements may receive an overcoat, or an additional overcoat, after they are mounted to the electronic component, to securely anchor the interconnection elements to the electronic component.

According to an aspect of the invention, the elongate element may be a wire having a round (circular) cross-section, or may be a "ribbon" or "ribbon-like", both of which terms refer to elongate elements having a non-circular cross-section, with a one cross (transverse) dimension preferably being at least twice (including at least three, four or five times) as large as another cross dimension. For example, an elongate element having a rectangular cross-section, said rectangle having a base dimension which is at least twice the height dimension (or vice-versa).

The use of the term "composite", throughout the description set forth herein, is consistent with a 'generic' meaning of the term (e.g., formed of two or more elements), and is not to be confused with any usage of the term "composite" in other fields of endeavor, for example, as it may be applied to materials such as glass, carbon or other fibers supported in a matrix of resin or the like.

As used herein, the term "spring shape" refers to virtually any shape of an elongate element which will exhibit elastic (restorative) movement of an end (tip) of the elongate element with respect to a force applied to the tip. This includes elongate elements shaped to have one or more bends, as well as substantially straight elongate elements.

As used herein, the terms "contact area", "terminal", "pad", and the like refer to any conductive area on any electronic component to which an interconnection element is mounted or makes contact.

Generally, the sacrificial substrate is not an electronic component. The sacrificial substrate is removed after shaping, and either before or after overcoating the core element.

According to an aspect of the invention, tips having various rough surface finishes can be formed on the sacrificial substrate prior to mounting the elongate element thereto. In this manner, after the sacrificial substrate is removed, the resulting interconnection element will have a tip structure at its end. The tip structures are preferably textured to ensure that reliable pressure connections can be made by the resulting interconnection element.

In an embodiment of the invention, the core (elongate element) is a "soft" material having a relatively low yield strength, and is overcoated with a "hard" material having a relatively high yield strength. For example, a soft material such as a gold wire is attached (e.g., by wire bonding) to an area on a sacrificial substrate, and is overcoated (e.g., by electrochemical plating) with a hard material such nickel and its alloys.

Vis-a-vis overcoating the core element, single and multi-layer overcoatings, "rough" overcoatings having microprotrusions (see also FIGS. 5C and 5D of the PARENT CASE), and overcoatings extending the entire length of or only a portion of the length of the core element, are described. In the latter case, the tip of the core element may suitably be exposed for making contact to an electronic component (see also FIG. 5B of the PARENT CASE).

Generally, throughout the description set forth herein, the term "plating" is used as exemplary of a number of techniques for overcoating the core. It is within the scope of this invention that the core can be overcoated by any suitable technique including, but not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Generally, for overcoating the core element with a metallic material such as nickel, electrochemical processes are preferred, especially electrolytic plating.

In another embodiment of the invention, the core is an elongate element of a "hard" material, inherently suitable to functioning as a "monolithic" (versus composite) spring element, and is mounted at one end to an area on a sacrificial substrate. The core, and at least an adjacent area of the terminal, is optionally overcoated with a material which will enhance its electrical characteristics. Such a monolithic elongate element can be mounted to a sacrificial substrate in any suitable manner including, but not limited to soldering, gluing, and piercing an end of the hard core into a soft portion of the sacrificial substrate.

In the main hereinafter, techniques involving beginning with a relatively soft (low yield strength) core element, which is generally of very small dimension (e.g., 2.0 mil or less) are described. Soft materials, such as gold, which attach easily to the metallization (e.g., aluminum) of semiconductor devices, generally lack sufficient resiliency to function as springs (Such soft, metallic materials exhibit primarily plastic, rather than elastic deformation.) Other soft materials which may attach easily to semiconductor devices and possess appropriate resiliency are often electrically non-conductive, as in the case of most elastomeric materials. In either case, desired structural and electrical characteristics can be imparted to the resulting composite interconnection element by the overcoating applied over the core. The resulting composite interconnection element can be made very small, yet can exhibit appropriate contact forces. Moreover, a plurality of such composite interconnection elements can be arranged at a fine pitch (e.g., 10 mils), even though the have a length (e.g., 100 mils) which is much greater than the distance to a neighboring composite interconnection element (the distance between neighboring interconnection elements being termed "pitch").

It is within the scope of this invention that composite interconnection elements can be fabricated on a microminiature scale, for example as "microsprings" for connectors and sockets, having cross-sectional dimensions on the order of twenty-five microns ($\mu$m), or less. This ability to manufacture reliable interconnection having dimensions measured in microns, rather than mils, squarely addresses the evolving needs of existing interconnection technology and future area array technology.

The composite interconnection elements of the present invention exhibit superior electrical characteristics, including electrical conductivity, solderability and low contact resistance. In many cases, deflection of the interconnection element in response to applied contact forces results in a "wiping" contact, which helps ensure that a reliable contact is made.

An additional advantage of the present invention is that connections made with the interconnection elements of the present invention are readily demountable. Soldering, to effect the interconnection to a terminal of an electronic component is optional, but is generally not preferred at a system level.

According to an aspect of the invention, techniques are described for making interconnection elements having controlled impedance. These techniques generally involve coating (e.g., electrophoretically) a core element or an entire composite interconnection element with a dielectric material (insulating layer), and overcoating the dielectric material with an outer layer of a conductive material. By grounding the outer conductive material layer, the resulting interconnection element can effectively be shielded, and its impedance can readily be controlled. (See also FIG. 10K of the PARENT CASE.)

According to an aspect of the invention, interconnection elements can be pre-fabricated as individual units, for later attachment to electronic components. Various techniques for accomplishing this objective are set forth herein. Although not specifically covered in this document, it is deemed to be relatively straightforward to fabricate a machine that will handle the mounting of a plurality of individual interconnection elements to a substrate or, alternatively, suspending a plurality of individual interconnection elements in an elastomer, or on a support substrate.

It should clearly be understood that the composite interconnection element of the present invention differs dramatically from interconnection elements of the prior art which have been coated to enhance their electrical conductivity characteristics or to enhance their resistance to corrosion.

The overcoating of the present invention is specifically intended to substantially enhance anchoring of the interconnection element to a terminal of an electronic component and/or to impart desired resilient characteristics to the resulting composite interconnection element. Stresses (contact forces) are directed to portions of the interconnection elements which are specifically intended to absorb the stresses.

One advantage of the invention is that the processes described herein are well-suited to "pre-fabricating" interconnection elements, particularly resilient interconnection elements, such as on a sacrificial member, then later mounting the interconnection elements to an electronic component. In contrast to fabricating the interconnection elements directly on the electronic component, this allows for reduced cycle time in processing the electronic components. Additionally, yield issues which may be associated with the fabrication of the interconnection elements are thus disassociated from the electronic component. For example, it would be disingenuous for an otherwise perfectly good, relatively expensive integrated circuit device to be ruined by glitches in the process of fabricating interconnection elements mounted thereto. The mounting of pre-fabricated interconnection elements to electronic components is relatively straightforward, as is evident from the description set forth hereinbelow.

It should also be appreciated that the present invention provides essentially a new technique for making spring structures. Generally, the operative structure of the resulting spring is a product of plating, rather than of bending and shaping. This opens the door to using a wide variety of materials to establish the spring shape, and a variety of "friendly" processes for attaching the "falsework" of the core to electronic components. The overcoating functions as a "superstructure" over the "falsework" of the core, both of which terms have their origins in the field of civil engineering.

Other objects, features and advantages of the invention will become apparent in light of the following description thereof.

BRIEF DESCRIPTION OF THE DRAWINGS

Reference will now be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

In the side views presented herein, often portions of the side view are presented in cross-section, for illustrative clarity. For example, in many of the views, the wire stem (core element) of a composite interconnection element (resilient contact structure) is shown full, as a bold line, while the overcoat is shown in true cross-section (often without crosshatching).

In the figures presented herein, the size of certain elements are often exaggerated (not to scale, vis-a-vis other elements in the figure), for illustrative clarity.

Figure 1A:
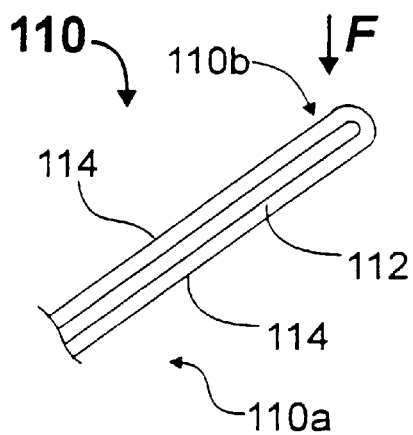

FIG. 1A is a cross-sectional view of a longitudinal portion, including one end, of an elongate interconnection element, according to an embodiment of the invention.

Figure 1B:
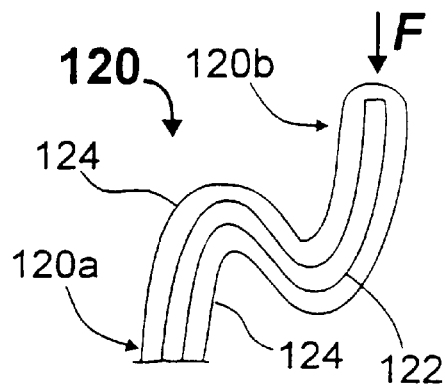

FIG. 1B is a cross-sectional view of a longitudinal portion, including one end, of an elongate interconnection element, according to another embodiment of the invention.

Figure 1C:
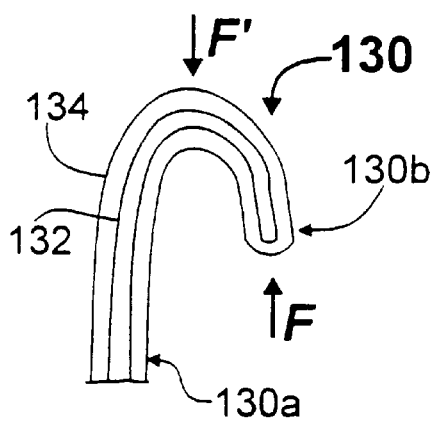

FIG. 1C is a cross-sectional view of a longitudinal portion, including one end of an elongate interconnection element, according to another embodiment of the invention.

Figure 1D:
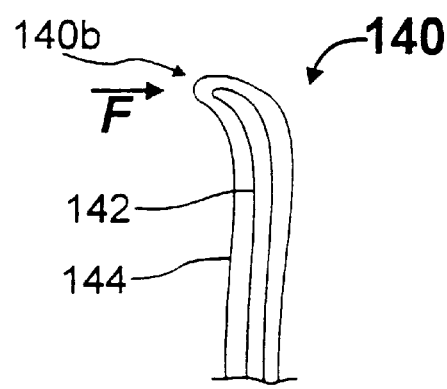

FIG. 1D is a cross-sectional view of a longitudinal portion, including one end of an elongate interconnection element, according to another embodiment of the invention.

Figure 1E:
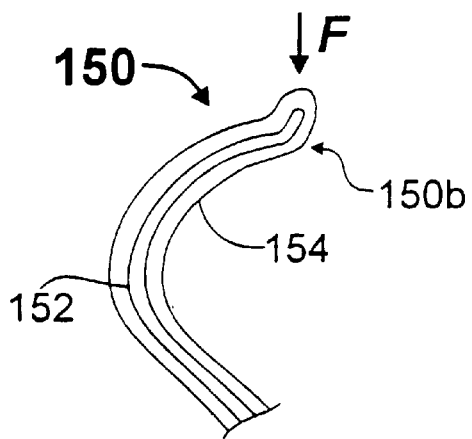

FIG. 1E is a cross-sectional view of a longitudinal portion, including one end of an elongate interconnection element, according to another embodiment of the invention.

FIG. 2A is a cross-sectional view of an elongate interconnection element mounted to a terminal of an electronic component and having a multi-layered shell, according to the invention.

FIG. 2B is a cross-sectional view of an elongate interconnection element having a multi-layered shell, wherein an intermediate layer is of a dielectric material, according to the invention.

FIG. 2C is a perspective view of a plurality of elongate interconnection elements mounted to an electronic component, according to the invention.

Figure 3A:
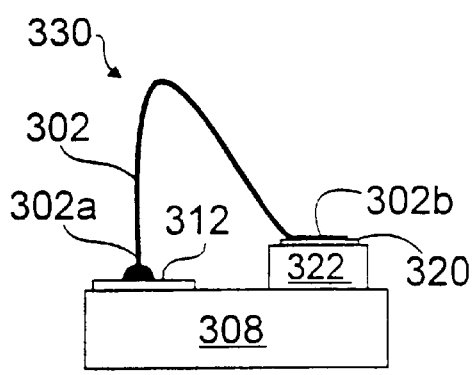

FIG. 3A is a side view of a wire configured into a loop, with one end of the wire bonded to a terminal of an electronic component and an opposite end of the wire bonded to a sacrificial layer, according to the invention.

Figure 3B:
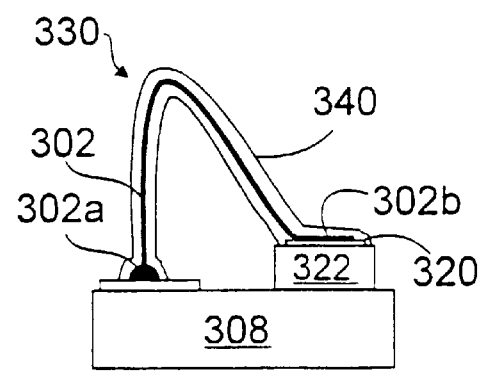

FIG. 3B is a side view of the looped wire of FIG. 3A after being overcoated, according to the invention.

Figure 3C:
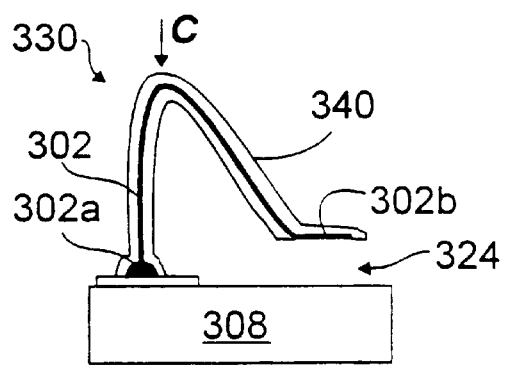

FIG. 3C is a side view of the looped, overcoated wire of FIG. 3B after the sacrificial element has been removed, according to the invention.

Figure 3D:
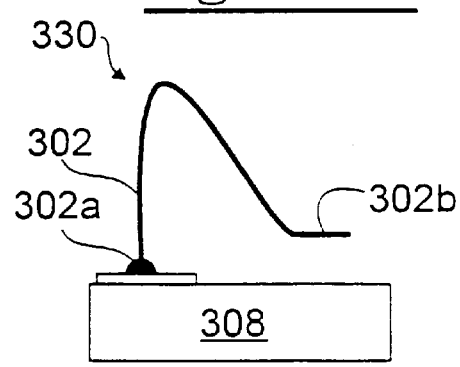

FIG. 3D is a side view of the looped wire of FIG. 1A after the sacrificial element has been removed, but before the wire has been overcoated, according to an alternate embodiment of the invention.

Figure 4A:
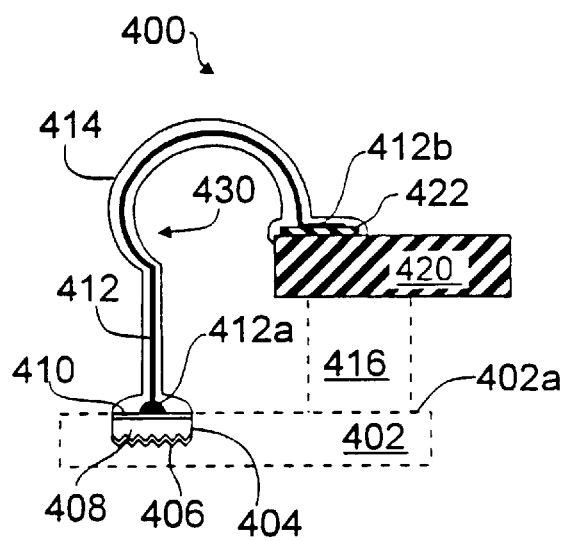

FIG. 4A is a side view of an elongate element extending between a terminal of an electronic component and a sacrificial substrate wherein a tip structure having a surface texture has previously been fabricated, according to the present invention.

Figure 4B:
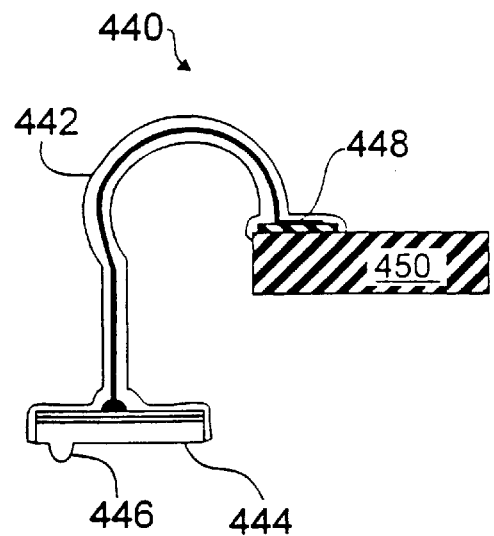

FIG. 4B is a side view of an elongate element extending between a terminal of an electronic component and a sacrificial substrate wherein a tip structure having a surface texture has previously been fabricated, according to the present invention.

Figure 4C:
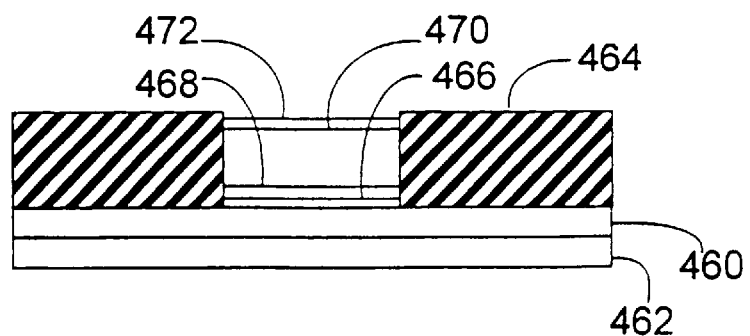

FIG. 4C is a side view of a multilayer tip structure (contact pad) for a resilient contact structure, according to the present invention.

Figure 5A:
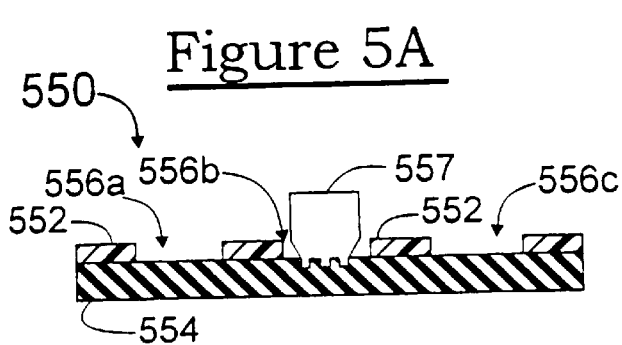

FIG. 5A is a cross-sectional view of an exemplary first step of a technique for manufacturing tip structures in a sacrificial substrate, said tip structures having surface texture, for interconnection elements, according to the invention.

Figure 5B:
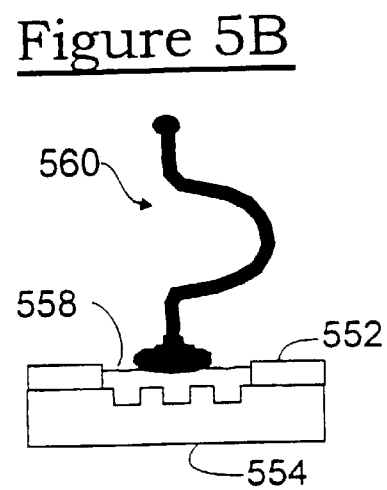

FIG. 5B is a cross-sectional view of an exemplary further step of the technique of FIG. 5A for manufacturing interconnection elements upon tip structures, according to the invention.

Figure 5C:
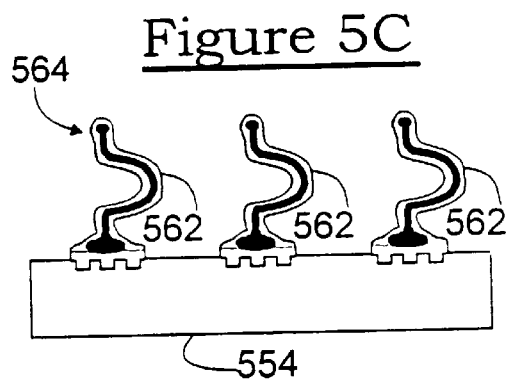

FIG. 5C is a cross-sectional view of an exemplary further step of the technique of FIG. 5B for fabricating elongate interconnection elements which are composite interconnection elements, according to the invention.

Figure 5D:
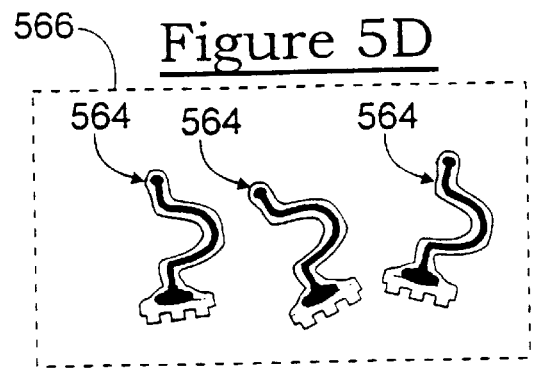

FIG. 5D is a cross-sectional view of an exemplary plurality of individual interconnection elements fabricated according to the technique of FIGS. 5A–5C, according to the invention.

Figure 5E:
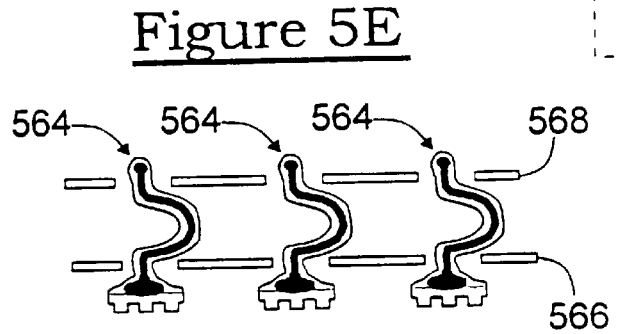

FIG. 5E is a cross-sectional view of an exemplary plurality of interconnection elements fabricated according to the technique of FIGS. 5A–5C, and associated in a prescribed spatial relationship with one another, according to the invention.

Figure 5F:
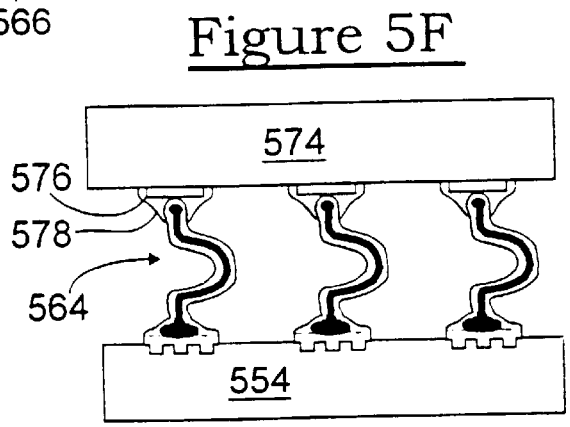

FIG. 5F is a cross-sectional view of a technique for mounting, en masse, a plurality of elongate interconnection elements fabricated upon a sacrificial substrate to an electronic component, according to the invention.

Figure 5G:
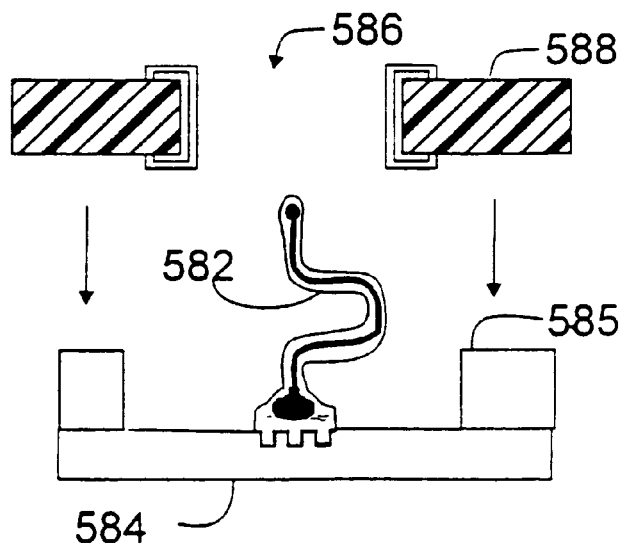
Figure 5H:
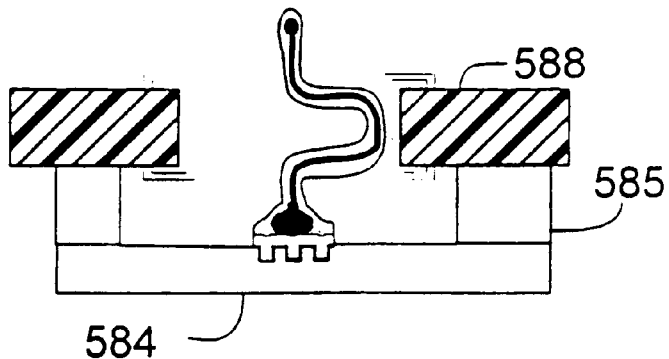
Figure 5I:
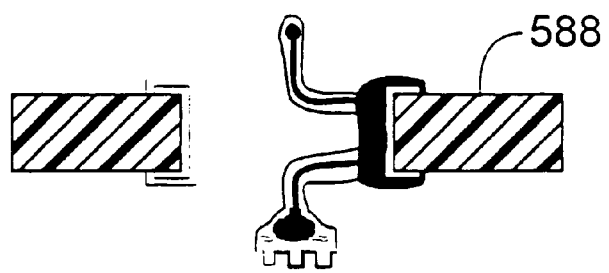

FIGS. 5G–5I are cross-sectional views of a technique for forming an interposer, according to the invention.

Figure 6A:
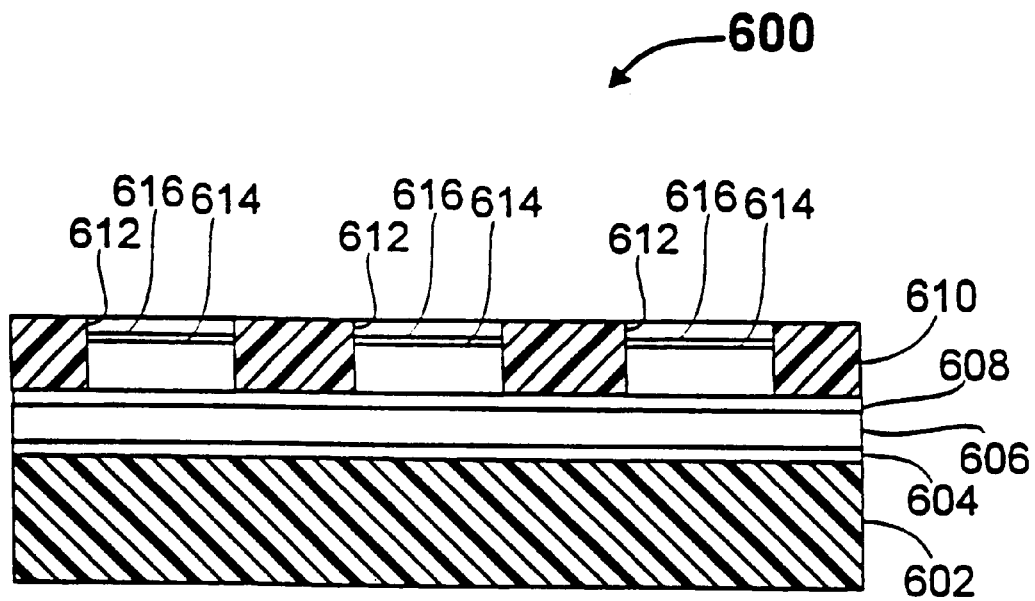

FIG. 6A is a cross-sectional view of a technique for fabricating tip structures for interconnection elements, according to the invention.

Figure 6B:
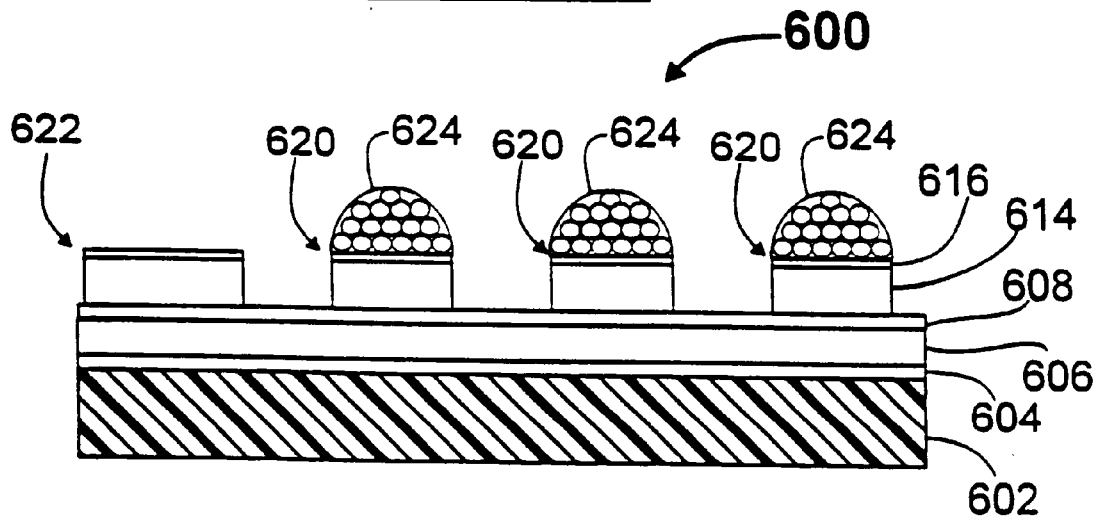

FIG. 6B is a cross-sectional view of further steps in the technique of FIG. 6A, according to the invention.

Figure 6C:
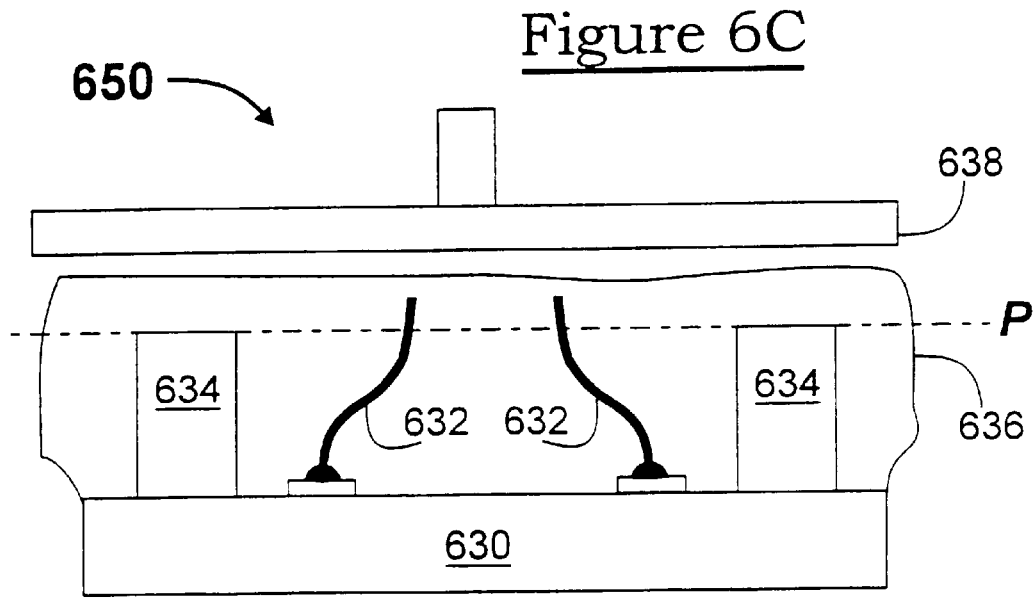

FIG. 6C is a side view, partially in cross-section and partially in full of an electronic component to which interconnection elements have been mounted, awaiting affixing tip structures thereto, according to the invention.

Figure 6D:
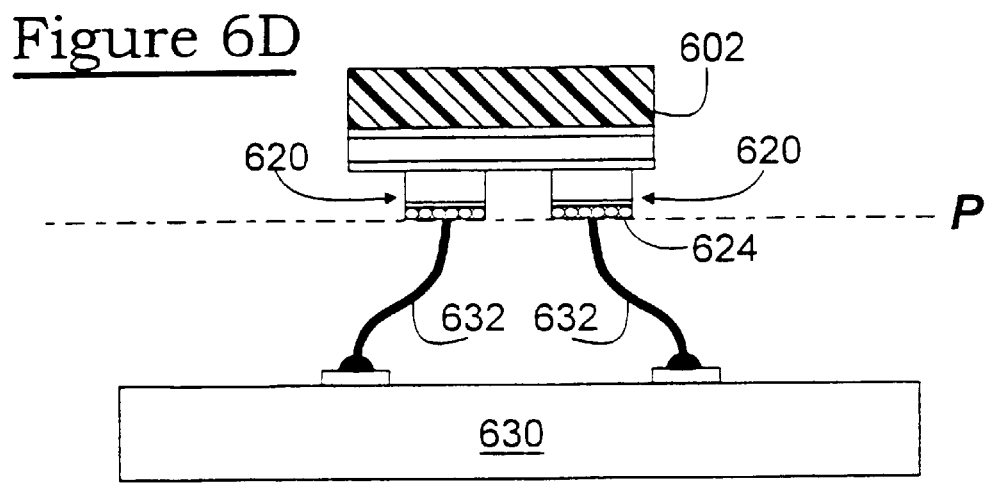

FIG. 6D is a side view, partially in cross-section and partially in full of the electronic component of FIG. 6C being joined with the tip structures of FIG. 6B, according to the invention.

Figure 6E:
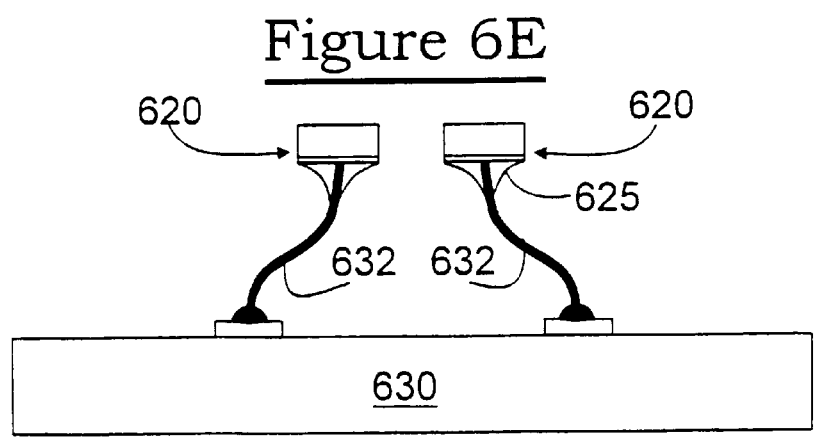
Figure 8A:
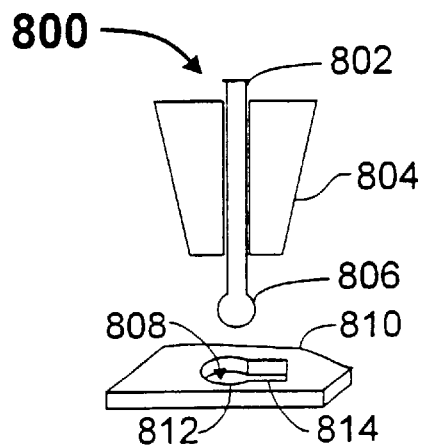
Figure 8B:
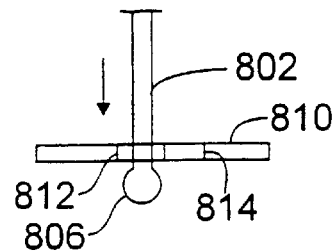

FIG. 6E is a side view, partially in cross-section and partially in full of a further step in joining the electronic component of FIG. 6C joined with the tip structures of FIG. 8B, according to the invention.

Figure 7A:
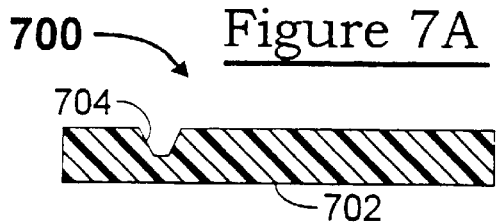
Figure 7B:
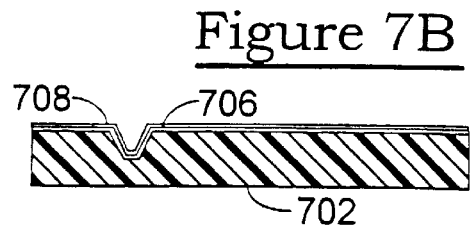
Figure 7C:
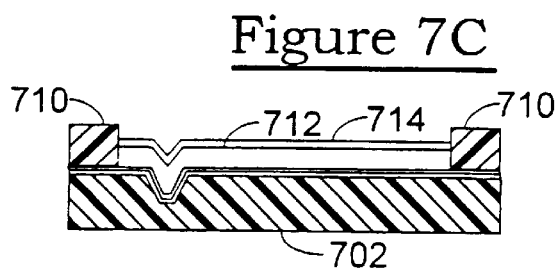

FIGS. 7A–7C are cross-sectional views of steps in a process of manufacturing cantilevered tip structures on a sacrificial substrate for interconnection elements, according to an embodiment of the invention.

Figure 7D:
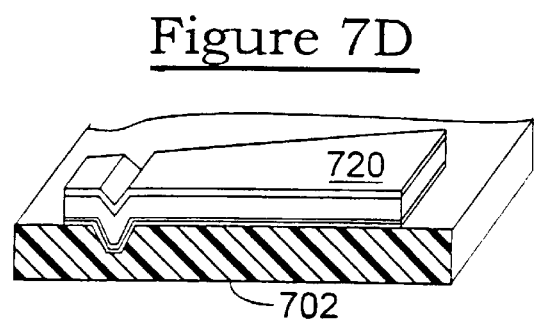

FIG. 7D is a perspective view of a cantilevered tip structure formed on a sacrificial substrate, according to the invention.

Figure 7E:
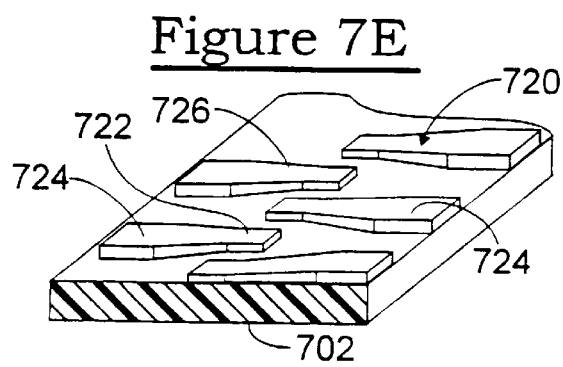

FIG. 7E is a perspective view of a plurality of cantilevered tip structures formed on a sacrificial substrate, according to the invention.

Figure 7F:
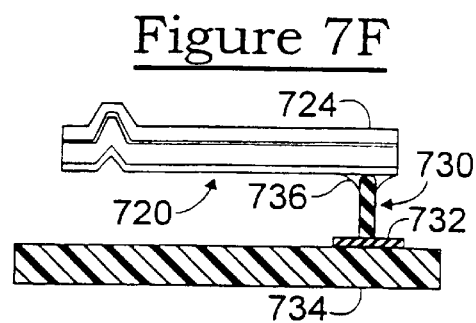

FIG. 7F is a side cross-sectional view, of a further step in the process of FIGS. 7A–7D, showing the cantilevered tip structures mounted to raised interconnection elements on a surface of an electronic component, according to the invention.

Figure 7G:
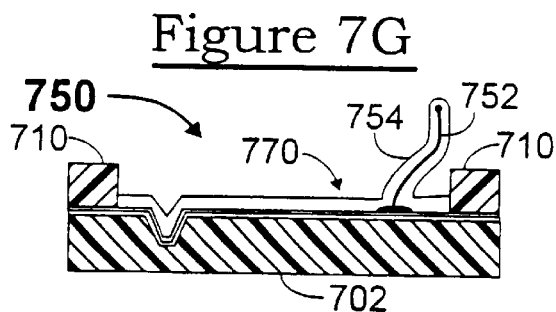
Figure 7H:
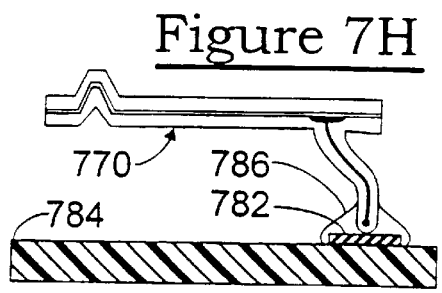

FIGS. 7G–7H are side cross-sectional view of another embodiment of fabricating cantilevered tip structures and mounting them to an electronic component, according to an alternate embodiment of the invention.

FIG. 8A is a side view, partially in cross-section and partially in perspective, of an alternate embodiment of forming interconnection elements on a sacrificial substrate for subsequent mounting to an electronic component, according to the invention.

Figure 8C:
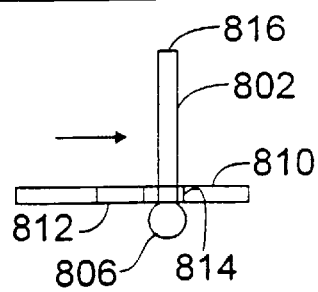

FIGS. 8B and 8C are side cross-sectional views of further steps in the technique of FIG. 8A, according to the invention.

Figure 9A:
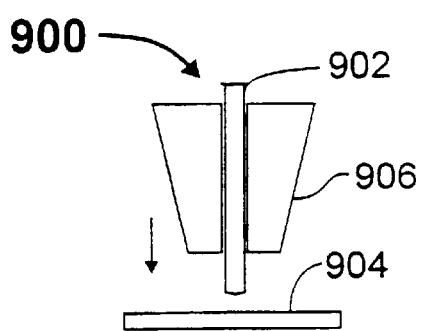
Figure 9B:
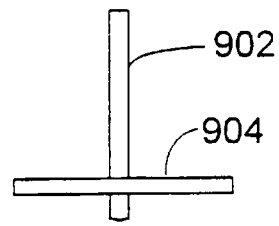

FIGS. 9A and 9B are side cross-sectional views of another technique for mounting a plurality of elongate elements to a sacrificial substrate, according to the invention.

Figure 9C:
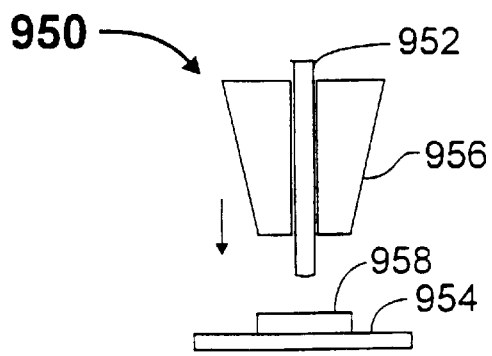

FIG. 9C is a side cross-sectional view of yet another technique for mounting a plurality of elongate elements to a sacrificial substrate, according to the invention.

DETAILED DESCRIPTION OF THE INVENTION

The invention relates to the fabrication of electrical interconnection (contact) elements and, more particularly, to contact elements which are resilient (springy) contact elements suitable for effecting pressure connections between electronic components.

The following types of sacrificial "elements" will be described: (a) sacrificial "layers"; and (b) sacrificial "substrates" (or "members").

The following uses of sacrificial elements will be described:

using sacrificial elements, "in situ", during the process of fabricating interconnection elements which are attached to electronic components;

using sacrificial elements to prefabricate interconnection elements for subsequent attachment to electronic components; and using sacrificial elements to prefabricate tip structures for subsequent attachment to interconnection elements.

It should be understood that the present invention is not limited to the composite interconnection elements (resilient contact structures) described in the aforementioned, commonly-owned U.S. patent application(s), although such composite interconnection elements are often used in the drawings and descriptions that follow to illustrate, in an exemplary manner, the applicability of the present invention.

COMPOSITE INTERCONNECTION ELEMENTS

The present invention particularly useful for, but is not limited to, fabricating composite interconnection elements. The disclosure of the aforementioned U.S. patent application Ser. No. 08/452,255, filed May 26, 1995 ("PARENT CASE") is incorporated by reference herein. This patent application summarizes several of the techniques disclosed therein.

An important aspect of the present invention is that a composite interconnection element can be formed by starting with a core (which may be mounted to a terminal of an electronic component), then overcoating the core with an appropriate material to: (1) establish the mechanical properties of the resulting "composite" interconnection element; and/or (2) when the interconnection element is mounted to a terminal of an electronic component, securely anchor the interconnection element to the terminal. In this manner, a resilient interconnection element (spring element) can be fabricated, starting with a core of a soft material which is readily shaped into a springable shape and which is readily attached to even the most fragile of electronic components. In light of prior art techniques of forming spring elements from hard materials, is not readily apparent, and is arguably counter-intuitive, that soft materials can form the basis of spring elements. Such a "composite" interconnection element is generally the preferred form of resilient contact structure (spring element) for use in the embodiments of the present invention.

FIGS. 1A, 1B, 1C and 1D illustrate, in a general manner, various shapes for composite interconnection elements, according to the present invention.

In the main, hereinafter, composite interconnection elements which exhibit resiliency are described. However, it should be understood that non-resilient composite interconnection elements fall within the scope of the invention.

Further, in the main hereinafter, composite interconnection elements that have a soft (readily shaped, and amenable to affixing by friendly processes to electronic components) core, overcoated by hard (springy) materials are described. It is, however, within the scope of the invention that the core can be a hard material—the overcoat serving primarily to securely anchor the interconnection element to a terminal of an electronic component.

In FIG. 1A, an electrical interconnection element 110 includes a core 112 of a "soft" material (e.g., a material having a yield strength of less than 40,000 psi), and a shell (overcoat) 114 of a "hard" material (e.g., a material having a yield strength of greater than 80,000 psi). The core 112 is an elongate element shaped (configured) as a substantially straight cantilever beam, and may be a wire having a diameter of 0.0005–0.0030 inches (0.001 inch=1 mil~25 microns ($\mu$m)). The shell 114 is applied over the already-shaped core 112 by any suitable process, such as by a suitable plating process (e.g., by electrochemical plating).

FIG. 1A illustrates what is perhaps the simplest of spring shapes for an interconnection element of the present invention—namely, a straight cantilever beam oriented at an angle to a force "F" applied at its tip 110b. When such a force is applied by a terminal of an electronic component to which the interconnection element is making a pressure contact, the downward (as viewed) deflection of the tip will evidently result in the tip moving across the terminal, in a "wiping" motion. Such a wiping contact ensures a reliable contact being made between the interconnection element and the contacted terminal of the electronic component.

By virtue of its "hardness", and by controlling its thickness (0.00025–0.00500 inches), the shell 114 imparts a desired resiliency to the overall interconnection element 110. In this manner, a resilient interconnection between electronic components (not shown) can be effected between the two ends 110a and 110b of the interconnection element 110. (In FIG. 1A, the reference numeral 110a indicates an end portion of the interconnection element 110, and the actual end opposite the end 110b is not shown.) In contacting a terminal of an electronic component, the interconnection element 110 would be subjected to a contact force (pressure), as indicated by the arrow labelled "F".

It is generally preferred that the thickness of the overcoat (whether a single layer or a multi-layer overcoat) be thicker than the diameter of the wire being overcoated. Given the fact that the overall thickness of the resulting contact structure is the sum of the thickness of the core plus twice the thickness of the overcoat, an overcoat having the same thickness as the core (e.g., 1 mil) will manifest itself, in aggregate, as having twice the thickness of the core.

The interconnection element (e.g., 110) will deflect in response to an applied contact force, said deflection (resiliency) being determined in part by the overall shape of the interconnection element, in part by the dominant (greater) yield strength of the overcoating material (versus that of the core), and in part by the thickness of the overcoating material.

As used herein, the terms "cantilever" and "cantilever beam" are used to indicate that an elongate structure (e.g., the overcoated core 112) is mounted (fixed) at one end, and the other end is free to move, typically in response to a force acting generally transverse to the longitudinal axis of the elongate element. No other specific or limiting meaning is intended to be conveyed or connoted by the use of these terms.

In FIG. 1B, an electrical interconnection element 120 similarly includes a soft core 122 (compare 112) and a hard shell 124 (compare 114). In this example, the core 122 is shaped to have two bends, and thus may be considered to be S-shaped. As in the example of FIG. 1A, in this manner, a resilient interconnection between electronic components (not shown) can be effected between the two ends 120a and 120b of the interconnection element 120. (In FIG. 1B, reference numeral 120a indicates an end portion of the interconnection element 120, and the actual end opposite the end 120b is not shown.) In contacting a terminal of an electronic component, the interconnection element 120 would be subjected to a contact force (pressure), as indicated by the arrow labelled "F".

In FIG. 1C, an electrical interconnection element 130 similarly includes a soft core 132 (compare 112) and a hard shell 134 (compare 114). In this example, the core 132 is shaped to have one bend, and may be considered to be U-shaped. As in the example of FIG. 1A, in this manner, a resilient interconnection between electronic components (not shown) can be effected between the two ends 130a and 130b of the interconnection element 130. (In FIG. 1C, the reference numeral 130a indicates an end portion of the interconnection element 130, and the actual end opposite the end 130b is not shown.) In contacting a terminal of an electronic component, the interconnection element 130 could be subjected to a contact force (pressure), as indicated by the arrow labelled "F". Alternatively, the interconnection element 130 could be employed to make contact at other than its end 130b, as indicated by the arrow labelled "F'".

FIG. 1D illustrates another embodiment of a resilient interconnection element 140 having a soft core 142 and a hard shell 144. In this example, the interconnection element 140 is essentially a simple cantilever (compare FIG. 1A), with a curved tip 140b, subject to a contact force "F" acting transverse to its longitudinal axis.

FIG. 1E illustrates another embodiment of a resilient interconnection element 150 having a soft core 152 and a hard shell 154. In this example, the interconnection element 150 is generally "C-shaped", preferably with a slightly curved tip 150b, and is suitable for making a pressure contact as indicated by the arrow labelled "F".

It should be understood that the soft core can readily be formed into any springable shape—in other words, a shape that will cause a resulting interconnection element to deflect resiliently in response to a force applied at its tip. For example, the core could be formed into a conventional coil shape. However, a coil shape would not be preferred, due to the overall length of the interconnection element and inductances (and the like) associated therewith and the adverse effect of same on circuitry operating at high frequencies (speeds).

The material of the shell, or at least one layer of a multi-layer shell (described hereinbelow) has a significantly higher yield strength than the material of the core. Therefore, the shell overshadows the core in establishing the mechanical characteristics (e.g., resiliency) of the resulting interconnection structure. Ratios of shell:core yield strengths are preferably at least 2:1, including at least 3:1 and at least 5:1, and may be as high as 10:1. It is also evident that the shell, or at least an outer layer of a multi-layer shell should be electrically conductive, notably in cases where the shell covers the end of the core. (The parent case, however, describes embodiments where the end of the core is exposed, in which case the core must be conductive.)

From an academic viewpoint, it is only necessary that the springing (spring shaped) portion of the resulting composite interconnection element be overcoated with the hard material. From this viewpoint, it is generally not essential that both of the two ends of the core be overcoated. As a practical matter, however, it is preferred to overcoat the entire core. Particular reasons for and advantages accruing to overcoating an end of the core which is anchored (attached) to an electronic component are discussed in greater detail hereinbelow.

Suitable materials for the core (112, 122, 132, 142) include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Vis-a-vis attaching an end of the core (wire) to a terminal of an electronic component (discussed in greater detail hereinbelow), generally, a wire of any material (e.g., gold) that is amenable to bonding (using temperature, pressure and/or ultrasonic energy to effect the bonding) would be suitable for practicing the invention. It is within the scope of this invention that any material amenable to overcoating (e.g., plating), including non-metallic material, can be used for the core.

Suitable materials for the shell (114, 124, 134, 144) include (and, as is discussed hereinbelow, for the individual layers of a multi-layer shell), but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the platinum group and their alloys; tungsten and molybdenum. In cases where a solder-like finish is desired, tin, lead, bismuth, indium and their alloys can also be used.

The technique selected for applying these coating materials over the various core materials set forth hereinabove will, of course, vary from application-to-application. Electroplating and electroless plating are generally preferred techniques. Generally, however, it would be counterintuitive to plate over a gold core. According to an aspect of the invention, when plating (especially electroless plating) a nickel shell over a gold core, it is desirable to first apply a thin copper initiation layer over the gold wire stem, in order to facilitate plating initiation.

An exemplary interconnection element, such as is illustrated in FIGS. 1A–1E may have a core diameter of approximately 0.001 inches and a shell thickness of 0.001 inches—the interconnection element thus having an overall diameter of approximately 0.003 inches (i.e., core diameter plus two times the shell thickness). Generally, this thickness of the shell will be on the order of 0.2–5.0 (one-fifth to five) times the thickness (e.g., diameter) of the core.

Some exemplary parameters for composite interconnection elements are:

(a) A gold wire core having a diameter of 1.5 mils is shaped to have an overall height of 40 mils and a generally C-shape curve (compare FIG. 1E) of 9 mils radius, is plated with 0.75 mils of nickel (overall diameter=1.5+2×0.75=3 mils), and optionally receives a final overcoat of 50 microinches of gold (e.g., to lower and enhance contact resistance). The resulting composite interconnection element exhibits a spring constant (k) of approximately 3–5 grams/mil. In use, 3–5 mils of deflection will result in a contact force of 9–25 grams. This example is useful in the context of a spring element for an interposer.

(b) A gold wire core having a diameter of 1.0 mils is shaped to have an overall height of 35 mils, is plated with 1.25 mils of nickel (overall diameter=1.0+2×1.25 =3.5 mils), and optionally receives a final overcoat of 50 microinches of gold. The resulting composite interconnection element exhibits a spring constant (k) of approximately 3 grams/mil, and is useful in the context of a spring element for a probe.

(c) A gold wire core having a diameter of 1.5 mils is shaped to have an overall height of 20 mils and a generally S-shape curve with radii of approximately 5 mils, is plated with 0.75 mils of nickel or copper (overall diameter=1.5+ 2×0.75=3 mils) The resulting composite interconnection element exhibits a spring constant (k) of approximately 2–3 grams/mil, and is useful in the context of a spring element for mounting on a semiconductor device.

The core element need not have a round cross-section, but may rather be a flat tab ("ribbon") having a generally rectangular cross-section extending from a sheet. It should be understood that, as used herein, the term "tab" is not to be confused with the term "TAB" (Tape Automated Bonding). Other non-circular cross-sections, such as C-shaped, I-shaped, L-shaped and T-shaped are within the scope of the invention.

FIG. 2A illustrates an embodiment 200 of an interconnection element 210 mounted to an electronic component 212 which is provided with a terminal 214. In this example, a soft (e.g., gold) wire core 216 is bonded (attached) at one end 216a to the terminal 214, is configured to extend from the terminal and have a spring shape (compare the shape shown in FIG. 1B), and is severed to have a free end 216b. Bonding, shaping and severing a wire in this manner is accomplished using wirebonding equipment. The bond at the end 216a of the core covers only a relatively small portion of the exposed surface of the terminal 214.

A shell (overcoat) is disposed over the wire core 216 which, in this example, is shown as being multi-layered, having an inner layer 218 and an outer layer 220, both of which layers may suitably be applied by plating processes. One or more layers of the multi-layer shell is (are) formed of a hard material (such as nickel and its alloys) to impart a desired resiliency to the interconnection element 210. For example, the outer layer 220 may be of a hard material, and the inner layer may be of a material that acts as a buffer or barrier layer (or as an activation layer, or as an adhesion layer) in plating the hard material 220 onto the core material 216. Alternatively, the inner layer 218 may be the hard material, and the outer layer 220 may be a material (such as soft gold) that exhibits superior electrical characteristics, including electrical conductivity and solderability. When a solder or braze type contact is desired, the outer layer of the interconnection element may be lead-tin solder or gold-tin braze material, respectively.

FIG. 2A illustrates, in a general manner, another key feature of the invention—namely, that resilient interconnection element can be securely anchored to a terminal on an electronic component. The attached end 210a of the interconnection element will be subject to significant mechanical stress, as a result of a compressive force (arrow "F") applied to the free end 210b of the interconnection element.

As illustrated in FIG. 2A, the overcoat (218, 220) covers not only the core 216, but also the entire remaining (i.e., other than the bond 216a) exposed surface of the terminal 214 adjacent the core 216 in a continuous (non-interrupted) manner. This securely and reliably anchors the interconnection element 210 to the terminal, the overcoat material providing a substantial (e.g., greater than 50%) contribution to anchoring the resulting interconnection element to the terminal. Generally, it is only required that the overcoat material cover at least a portion of the terminal adjacent the core. It is generally preferred, however, that the overcoat material cover the entire remaining surface of the terminal. Preferably, each layer of the shell is metallic.

As a general proposition, the relatively small area at which the core is attached (e.g., bonded) to the terminal is not well suited to accommodating stresses resulting from contact forces ("F") imposed on the resulting composite interconnection element. By virtue of the shell covering the entire exposed surface of the terminal (other than in the relatively small area comprising the attachment of the core end 216a to the terminal), the overall interconnection structure is firmly anchored to the terminal. The adhesion strength, and ability to react contact forces, of the overcoat will far exceed that of the core end (216a) itself.

As used herein, the term "electronic component" (e.g., 212) includes, but is not limited to: interconnect and interposer substrates; semiconductor wafers and dies, made of any suitable semiconducting material such as silicon (Si) or gallium-arsenide (GaAs); production interconnect sockets; test sockets; sacrificial members, elements and substrates, as described in the parent case; semiconductor packages, including ceramic and plastic packages, and chip carriers; and connectors.

The interconnection element of the present invention is particularly well suited for use as:

interconnection elements mounted directly to silicon dies, eliminating the need for having a semiconductor package;

interconnection elements extending as probes from substrates (described in greater detail hereinbelow) for testing electronic components; and interconnection elements of interposers (discussed in greater detail hereinbelow).

The interconnection element of the present invention is unique in that it benefits from the mechanical characteristics (e.g., high yield strength) of a hard material without being limited by the attendant typically poor bonding characteristic of hard materials. As elaborated upon in the parent case, this is made possible largely by the fact that the shell (overcoat) functions as a "superstructure" over the "falsework" of the core, two terms which are borrowed from the milieu of civil engineering. This is very different from plated interconnection elements of the prior art wherein the plating is used as a protective (e.g., anti-corrosive) coating, and is generally incapable of imparting the desired mechanical characteristic to the interconnection structure. And this is certainly in marked contrast to any non-metallic, anticorrosive coatings, such as benzotriazole (BTA) applied to electrical interconnects.

Among the numerous advantages of the present invention are that a plurality of free-standing interconnect structures are readily formed on substrates, from different levels thereof such as a PCB having a decoupling capacitor) to a common height above the substrate, so that their free ends are coplanar with one another. Additionally, both the electrical and mechanical (e.g., plastic and elastic) characteristics of an interconnection element formed according to the invention are readily tailored for particular applications. For example, it may be desirable in a given application that the interconnection elements exhibit both plastic and elastic deformation. (Plastic deformation may be desired to accommodate gross non-planarities in components being interconnected by the interconnection elements.) When elastic behavior is desired, it is necessary that the interconnection element generate a threshold minimum amount of contact force to effect a reliable contact. It is also advantageous that the tip of the interconnection element makes a wiping contact with a terminal of an electronic component, due to the occasional presence of contaminant films on the contacting surfaces.

As used herein, the term "resilient", as applied to contact structures, implies contact structures (interconnection elements) that exhibit primarily elastic behavior in response to an applied load (contact force), and the term "compliant" implies contact structures (interconnection elements) that exhibit both elastic and plastic behavior in response to an applied load (contact force). As used herein, a "compliant" contact structure is a "resilient" contact structure. The composite interconnection elements of the present invention are a special case of either compliant or resilient contact structures.

A number of features are elaborated upon in detail, in the PARENT CASE, including, but not limited to: fabricating the interconnection elements on sacrificial substrates; gang-transferring a plurality of interconnection elements to an electronic component; providing the interconnection elements with contact tips, preferably with a rough surface finish; employing the interconnection elements on an electronic component to make temporary, then permanent connections to the electronic component; arranging the interconnection elements to have different spacing at their one ends than at their opposite ends; fabricating spring clips and alignment pins in the same process steps as fabricating the interconnection elements; employing the interconnection elements to accommodate differences in thermal expansion between connected components; eliminating the need for discrete semiconductor packages (such as for SIMMs); and optionally soldering resilient interconnection elements (resilient contact structures).

FIG. 2B shows a composite interconnection element 220 having multiple layers. An innermost portion (inner elongate conductive element) 222 of the interconnection element 220 is either an uncoated core or a core which has been overcoated, as described hereinabove. The tip 222b of the innermost portion 222 is masked with a suitable masking material (not shown). A dielectric layer 224 is applied over the innermost portion 222 such as by an electrophoretic process. An outer layer 226 of a conductive material is applied over the dielectric layer 224.

In use, electrically grounding the outer layer 226 will result in the interconnection element 220 having controlled impedance. An exemplary material for the dielectric layer 224 is a polymeric material, applied in any suitable manner and to any suitable thickness (e.g., 0.1–3.0 mils).

The outer layer 226 may be multi-layer. For example, in instances wherein the innermost portion 222 is an uncoated core, at least one layer of the outer layer 226 is a spring material, when it is desired that the overall interconnection element exhibit resilience.

FIG. 2C illustrates an embodiment 250 wherein a plurality (six of many shown) of interconnection elements 251 . . . 256 are mounted on a surface of an electronic component 260, such as a probe card insert (a subassembly mounted in a conventional manner to a probe card). Terminals and conductive traces of the probe card insert are omitted from this view, for illustrative clarity. The attached ends 251a . . . 256a of the interconnection elements 251 . . . 256 originate at a first pitch (spacing), such as 0.050–0.100 inches. The interconnection elements 251 . . . 256 are shaped and/or oriented so that their free ends (tips) are at a second, finer pitch, such as 0.005–0.010 inches. An interconnect assembly which makes interconnections from a one pitch to another pitch is typically referred to as a "space transformer".

As illustrated, the tips 251b . . . 256b of the interconnection elements are arranged in two parallel rows, such as for making contact to (for testing and/or burning in) a semiconductor device having two parallel rows of bond pads (contact points). The interconnection elements can be arranged to have other tip patterns, for making contact to electronic components having other contact point patterns, such as arrays.

Generally, throughout the embodiments disclosed herein, although only one interconnection element may be shown, the invention is applicable to fabricating a plurality of interconnection components and arranging the plurality of interconnection elements in a prescribed spatial relationship with one another, such as in a peripheral pattern or in a rectangular array pattern.

TECHNIQUES EMPLOYING SACRIFICIAL SUBSTRATES

The mounting of interconnection elements directly to terminals of electronic components has been discussed hereinabove. Generally speaking, the interconnection elements of the present invention can be fabricated upon, or mounted to, any suitable surface of any suitable substrate, including sacrificial substrates, then either removed therefrom or mounted to terminals of electronic components.

Prior to describing these techniques of fabricating interconnection elements directly upon sacrificial substrates, a brief discussion follows relating to the use of sacrificial layers on an electronic component to assist in the fabrication of composite interconnection elements.

SACRIFICIAL ELEMENTS WHICH ARE LAYERS

As described in the aforementioned, commonly-owned U.S. patent application Ser. Nos. 08/152,812 (now U.S. Pat. No. 5,476,211) and 08/452,255, resilient contact structures can be formed by bonding a one end of a wire to a terminal on an electronic component and bonding an opposite end of the wire to a sacrificial element which is a layer upon the electronic component. See FIGS. 6a–6c and 8A–8C therein, respectively.

FIGS. 3A–3D, presented herein, correspond to FIGS. 8A–8D of the aforementioned, commonly-owned U.S. patent application Ser. No. 08/452,255.

FIG. 3A illustrates at a wire 302 having its proximal end 302a bonded to a first terminal 312 on a substrate 308 can be formed into a U-shaped loop and, rather than severing the distal end 302b of the wire 302, bonding the distal end 302b of the wire to a second terminal 320 with a suitable wedge-bond or the like.

The resulting loop-shaped wire stem 330 is overcoated, as shown in FIG. 3B, with a one or multi-layer coating 340 which envelops the entire wire stem 330 and the terminals 312, 320. The second terminal 320 is suitably positioned atop a sacrificial layer which serves as an electrical contact point for electroplating processes (if such processes are employed to overcoat the wire stem), and also serves to provide a different (higher) z-axis coordinate for the two ends of the wire stem 302a and 302b.

As illustrated in FIG. 3C, after overcoating the wire stem, the sacrificial layer 322 can be removed (such as by selective etching), leaving a gap 324 between the end 302b and the surface of the substrate 308. The "suspension" of the end 302b is especially important for formation of controlled geometry spring contacts, capable of resiliently engaging with mating terminals on a component or a substrate for burning-in or testing (discussed in greater detail hereinbelow) an electronic component (such as a semiconductor die), or for providing a demountable electrical interconnect to an electronic component. The gap 324 allows for z-axis deflection (movement) of the tip 302b of the resulting contact structure when a force is applied thereto.

As illustrated in FIG. 3C, it is intended that the contact structure 330 make contact at a point along its length, rather than at its distal end (302b). This is illustrated by the downward pointing arrow labelled "C".

FIG. 3D illustrates that the procedure described immediately hereinabove could be re-ordered, so that the sacrificial layer (322 of FIG. 3A) could be removed prior to overcoating the wire stem (see, e.g., FIG. 3B).

Preferably, the resulting interconnection element is a "composite interconnection element" wherein the overcoat, which may be a multilayer coating, imparts a desired resiliency to and substantially dominates the resiliency of the resulting interconnection element (resilient contact structure), as described in the aforementioned, commonly-owned U.S. patent applications. Such a use of a sacrificial element can be considered to be an "in situ" use of same.

EXTENDING THE CORE ELEMENT (e.g., WIRE) BEYOND THE ELECTRONIC COMPONENT

In the aforementioned example of using a sacrificial layer, the resulting resilient contact structure is confined (so to speak) to being completely upon the electronic component.

In the example that follows, the sacrificial element is a sacrificial member (or substrate) which is located remote from the electronic component, which results in a resilient contact structure which is useful as, but not limited to, a probe element.

FIGS. 4A–4C, presented herein, correspond to FIGS. 9A–9C of the aforementioned, commonly-owned U.S. patent application Ser. No. 08/452,255. See also FIGS. 14–15 of the aforementioned, commonly-owned U.S. patent application Ser. No. 08/340,144.

FIG. 4A illustrates an embodiment 400 of the use of a sacrificial member 402 (shown in dashed lines) in conjunction with forming a resilient contact structure 430 suitable for use as a probe. In this example, the sacrificial member is suitably formed of aluminum.

A plurality (one of many shown) of depressions 404 are formed, such as by etching, engraving, stamping, punching, dimpling, or the like, in the top surface 402a of the sacrificial member 402. In this example, the bottom (as viewed) surface of the depression 404 has an irregular topography, such as in the form of inverted pyramids ending in apexes.

A tip structure can then be fabricated in the depression, as follows. For example, a thin layer 406 of a conductive material, such as gold or rhodium (alternatively, tin or solder, such as when contacting solder terminals) is deposited in the depression, in any known manner. The depression 404 is then substantially filled with a conductive material 408 such as nickel, in any known manner. A layer 410 of a conductive material such as gold is then deposited over the filler material 408, in any known manner. This sandwich structure of gold (406), nickel (408) and gold (410) forms a suitable tip structure ("contact pad") for a probe element.

A wire 412 is bonded at its proximal end 412a to the surface of the layer 410, and is configured to extend over an edge of an electronic component 420, whereat the wire is severed and its distal end 412b bonded to a terminal 422 on the electronic component 420. The wire 412 is thus seen to project off (beyond) the edge of the component 420.

The wire 412 is then overcoated with at least one layer of a conductive material 414, such as nickel, which also overcoats the terminal 422 on the electronic component. To ensure that the overcoating covers only a desired area on the sacrificial member, the entire surface of the sacrificial member, except for the depressions (204) can be masked with a suitable masking material, such as with photoresist (not shown). (This masking material may be "leftover" from forming and filling the depressions to fabricate the contact pads.)

As is shown, the sacrificial member 402 is maintained in a predetermined position with respect to the electronic component 420 by a suitable standoff element 416 (shown in dashed lines), which may simply be photoresist material.

Upon completion, the standoff element 416 and the sacrificial member 402 are removed, leaving resilient contact structures 430 extending from the electronic component 420, each of which has a contact pad of controlled geometry at its end. For example, the apexes of the inverted pyramids of the contact pad are useful, in the context of probing, for effecting reliable electrical connection to a terminal (pad) of another electronic component (not shown) which is desired to be probed (e.g., for burn-in, testing or the like). With relatively low overall forces involved, the points (apexes) will partially penetrate the terminal of the electronic component being probed. Generally, in this case, the electronic component 420 would be a test card (printed circuit board) having a plurality of probe elements (230) extending to an area whereat an electronic component being probed would be introduced. The test card would suitably be in the form of a ring, with the probes 430 extending from an inner edge of the ring to below the ring.

It is within the scope of this invention that the sequence of events described hereinabove be re-arranged so that:

(a) the wire 412 is bonded first to the terminal 422 of the electronic component 420; and/or (b) the wire 412 is overcoated (414) after the sacrificial member 402 is removed.

FIG. 4B shows an embodiment 440 of a completed probe 442 which is similar to the probe 430 of the previous embodiment 400, with the following differences. In this case, the end of the probe 442 (compare 430) is bonded to a contact pad 444 which has a single projecting nub 446, rather than a plurality of points, and the end 448 (compare 412b) of the probe 442 is bonded to the electronic component 450 (compare 420).

As illustrated in FIG. 4C, a useful (e.g., preferred) contact tip for an interconnection element can be formed in (or on) a sacrificial member, in the following manner, on a thin aluminum (foil) sacrificial member 460:

provide a temporary backing 462, such as a plastic sheet, for the foil, to increase the structural integrity of the foil (this also acts as a plating barrier/mask);

pattern the face of the foil with a thin (approximately 3 mil) layer of photoresist 464, or the like, leaving openings at locations whereat it is desired to form contact tips;

deposit (such as by plating) a thin (approximately 100$\mu$") layer 466 of hard gold onto the foil, within the openings in the photoresist;

deposit (such as by plating) a very thin (approximately 5–10$\mu$") layer ("strike") of copper 468 onto the layer of hard gold (it should be understood that such a copper strike is somewhat optional, and is provided principally to assist in subsequent plating of the previous gold layer 266);

deposit (such as by plating) a thick (approximately 2 mil) layer 470 of nickel onto the copper strike; and deposit (such as by plating) a thin (approximately 100μ") layer 472 of soft gold onto the nickel.

This forms a 4-layer contact tip, to which a gold wire (not shown) is readily bonded (to the soft gold layer), having a hard gold surface (466) for contacting electronic components, a nickel layer (470) providing strength, and a soft gold layer (472) which is readily bonded to. As described hereinabove, after bonding the wire to the sacrificial member (460), the wire is plated (e.g., with nickel) and the sacrificial member is removed (or vice-versa).

It is within the scope of this invention that a sacrificial substrate can be utilized for the purpose of electrically shorting (interconnecting) free ends of elongate interconnection elements which are mounted to electronic components, for facilitating electroplating, and the like. Attention is directed, for example, to FIGS. 16A–16C of the PARENT CASE (U.S. Ser. No. 08/452,255).

It is also within the scope of this invention that a sacrificial substrate can be utilized for the purpose of establishing a "waypoint" at a midsection of an elongate interconnection element, and that a pre-fabricated tip structure can be mounted to the midsection of the elongate interconnection element, such as is illustrated for example in FIGS. 20A–20B of the PARENT CASE (U.S. Ser. No. 08/452, 255).

PRE-FABRICATING INTERCONNECTION ELEMENTS ON SACRIFICIAL MEMBERS

The fabrication of interconnection elements having one end mounted to an electronic component has been discussed hereinabove.

According to the present invention, the interconnect elements can be entirely pre-fabricated on a sacrificial member (substrate) prior to mounting the interconnection elements to an electronic component, or in a socket configuration, or the like.

FIGS. 5A–5E herein are similar to FIGS. 11A–11F of the aforementioned U.S. patent application Ser. No. 08/452,255 and are similar to FIGS. 2D–2H of the aforementioned U.S. patent application Ser. No. 08/554,902, and illustrate fabricating a plurality of interconnection elements (such as, but not limited to resilient contact structures) as separate and distinct structures for subsequent mounting to electronic components. FIG. 5F herein is similar to FIGS. 12A–12C of the aforementioned U.S. patent application Ser. No. 08/452, 255, which illustrates that the plurality of interconnection elements which are mounted to a sacrificial substrate (carrier) can subsequently be transferred en masse to an electronic component.

FIGS. 5A–5D illustrate a technique for fabricating a plurality of interconnection elements upon a sacrificial substrate. In this example, the sacrificial substrate is optionally first prepared with a plurality of tip structures.

FIG. 5A illustrates a first step of the technique 550, in which a patterned layer of masking material 552 is applied onto a surface of a sacrificial substrate 554. The sacrificial substrate 554 may be of thin (1–10 mil) copper or aluminum foil, by way of example, and the masking material 552 may be common photoresist. The masking layer 552 is patterned to have a plurality (three of many shown) of openings at locations 556a, 556b, 556c whereat it is desired to fabricate interconnection elements. The locations 556a, 556b and 556c are, in this sense, comparable to the terminals of an electronic component. The locations 556a, 556b and 556c are preferably treated at this stage to have a rough or featured surface texture. As shown, this may be accomplished mechanically with an embossing tool 557 forming depressions in the foil 554 at the locations 556a, 556b and 556c. Alternatively, the surface of the foil at these locations can be chemically etched to have a surface texture. Any technique suitable for effecting this general purpose is within the scope of this invention, for example sand blasting, peening, punching, stamping, and the like.

Next, a plurality (one of many shown) of conductive tip structures 558 are formed at each location (e.g., 556b), as illustrated by FIG. 5B. This may be accomplished using any suitable technique, such as electroplating, and may include tip structures having multiple layers of material. For example, the tip structure 558 may have a thin (e.g., 10–100 microinch) barrier layer of nickel applied onto the sacrificial substrate, followed by a thin (e.g., 10 microinch) layer of soft gold, followed by a thin (e.g., 20 microinch) layer of hard gold, followed by a relatively thick (e.g., 200 microinch) layer of nickel, followed by a final thin (e.g., 100 microinch) layer of soft gold. Generally, the first thin barrier layer of nickel is provided to protect the subsequent layer of gold from being "poisoned" by the material (e.g., aluminum, copper) of the substrate 554, the relatively thick layer of nickel is to provide strength to the tip structure, and the final thin layer of soft gold provides a surface which is readily bonded to. The invention is not limited to any particulars of how the tip structures are formed on the sacrificial substrate, as these particulars would inevitably vary from application-to-application.

As illustrated by FIG. 5B, a plurality (one of many shown) of core elements 560 for composite interconnection elements may be formed on the tip structures 558, such as by any of the techniques of bonding a soft wire core to a terminal of an electronic component described in the aforementioned commonly-owned U.S. patent applications. The core elements 560 are then overcoated with a preferably hard material 562 in the manner described hereinabove, and the masking material 552 is then removed, resulting in a plurality (three of many shown) of free-standing interconnection elements 564 mounted to a surface of the sacrificial substrate, as illustrated by FIG. 5C.

Whether or not the interconnection element is intended to be a composite interconnection element or a monolithic interconnection element, it is preferred to provide an overcoat 562 which will firmly anchor the core elements 560 to their respective tip structures 558 and, if desired, imparts resilient characteristics to the resulting interconnection elements 564. As noted in the aforementioned commonly-owned U.S. patent application Ser. No. 08/452,255, the plurality of interconnection elements mounted to the sacrificial substrate may be gang-transferred to terminals of an electronic component. Alternatively, two widely divergent paths may be taken.

As illustrated by FIG. 5D, the sacrificial substrate 554 may simply be removed, by any suitable process such as selective chemical etching. Since most selective chemical etching processes will etch one material at a much greater rate than an other material, and the other material may slightly be etched in the process, this phenomenon is advantageously employed to remove the thin barrier layer of nickel in the tip structure contemporaneously with removing the sacrificial substrate. However, if need be, the thin nickel barrier layer can be removed in a subsequent etch step. This results in a plurality (three of many shown) of individual, discrete, singulated interconnection elements 564, as indicated by the dashed line 566, which may later be mounted (such as by soldering or brazing) to terminals on electronic components.

It bears mention that the overcoat material may also be slightly thinned in the process of removing the sacrificial substrate and/or the thin barrier layer. However, it is preferred that this not occur.

To prevent thinning of the overcoat, it is preferred that a thin layer of gold or, for example, approximately 10 microinches of soft gold applied over approximately 20 microinches of hard gold, be applied as a final layer over the overcoat material 562. Such an outer layer of gold is intended primarily for its superior conductivity, contact resistance, and solderability, and is generally highly impervious to most etching solutions contemplated to be used to remove the thin barrier layer and the sacrificial substrate.

Alternatively, as illustrated by FIG. 5E, prior to removing the sacrificial substrate 554, the plurality (three of many shown) of interconnection elements 564 may be "fixed" in a desired spatial relationship with one another by any suitable support structure 566, such as by a thin plate having a plurality of holes therein, whereupon the sacrificial substrate is removed. The support structure 566 may be of a dielectric material, or of a conductive material overcoated with a dielectric material. Further processing steps (not illustrated) such as mounting the plurality of interconnection elements to an electronic component such as a silicon wafer or a printed circuit board may then proceed. Additionally, in some applications, it may be desireable to stabilize the tips (opposite the tip structures) of the interconnection elements 564 from moving, especially when contact forces are applied thereto. To this end, it may also be desirable to constrain movement of the tips of the interconnection elements with a suitable sheet 568 having a plurality of holes, such as a mesh formed of a dielectric material.

A distinct advantage of the technique 550 described hereinabove is that tip structures (558) may be formed of virtually any desired material and having virtually any desired texture. As mentioned hereinabove, gold is an example of a noble metal that exhibits excellent electrical characteristics of electrical conductivity, low contact resistance, solderability, and resistance to corrosion. Since gold is also malleable, it is extremely well-suited to be a final overcoat applied over any of the interconnection elements described herein, particularly the resilient interconnection elements described herein. Other noble metals exhibit similar desirable characteristics. However, certain materials such as rhodium which exhibit such excellent electrical characteristics would generally be inappropriate for overcoating an entire interconnection element. Rhodium, for example, is notably brittle, and would not perform well as a final overcoat on a resilient interconnection element. In this regard, techniques exemplified by the technique 550 readily overcome this limitation. For example, the first layer of a multi-layer tip structure (see 558) can be rhodium (rather than gold, as described hereinabove), thereby exploiting its superior electrical characteristics for making contact to electronic components without having any impact whatsoever on the mechanical behavior of the resulting interconnection element.

FIG. 5F illustrates of gang-transferring a plurality of interconnection elements 564 which have been pre-fabricated on a sacrificial substrate 554 to terminals 576 on an electronic component 574. The tips (top ends, as viewed) of the interconnection elements are suitably (optionally) soldered or brazed with a joining material 578 to the terminals 576 of the electronic component 574.

FIG. 5G illustrates that a plurality (one of many shown) of free-standing interconnection elements 582 (compare 562) extending from a sacrificial substrate 584 (compare 554) can be mounted through a corresponding plurality (one of many shown) of holes 586 in a substrate 588, such as by soldering (see FIG. 5H) or with an elastomer (not shown) so that the substrate 588 has a plurality of interconnection elements supported therein and extending from opposite surfaces thereof. A standoff element 585, such as photoresist, establishes a prescribed spacing between the sacrificial substrate 584 and the substrate 588. FIG. 5I illustrates the final product once the sacrificial substrate 584 is removed. Such a substrate 588 can be used as an interposer between two (or more) electronic components to interconnect terminals from a one of the electronic components to an other of the electronic components. FIGS. 5G–5I correspond to FIGS. 22D–22F of the PARENT CASE (U.S. patent application Ser. No. 08/452,255), wherein further discussion of interposers can readily be found.

It is within the scope of this invention that a silicon wafer can be used as the sacrificial substrate upon which tip structures are fabricated, and that tip structures so fabricated may be joined (e.g., soldered, brazed) to interconnection elements which have previously been mounted to an electronic component. Further discussion of these techniques are found in FIGS. 6A–6E, hereinbelow.

PRE-FABRICATING TIP STRUCTURES ON SACRIFICIAL MEMBERS

In the preceding example, interconnection elements are fabricated upon a sacrificial substrate, preferably at sites that have previously been prepared with tip structures.

In the example that follows, the sacrificial element is a sacrificial member (or substrate) which is used to pre-fabricate tip structures for subsequent attachment to existing interconnection elements.

FIGS. 4A–4E, presented herein, correspond generally to FIGS. 8A–8E of the aforementioned, commonly-owned U.S. patent application Ser. No. 08/554,902.

FIG. 6A illustrates a technique 600 for fabricating tip structures on a sacrificial substrate, for subsequent attaching to tips of interconnection elements extending from a surface of an electronic component, and is particularly useful for the aforementioned composite interconnection elements. In this example, a silicon substrate (wafer) 602 having a top (as viewed) surface is used as the sacrificial substrate. A layer 604 of titanium is deposited (e.g., by sputtering) onto the top surface of the silicon substrate 602, and has a thickness of approximately 250 Å (1 Å=0.1 nm=$10^{-10}$ m). A layer 606 of aluminum is deposited (e.g., by sputtering) atop the titanium layer 604, and has a thickness of approximately 10,000 Å. The titanium layer 604 is optional and serves as an adhesion layer for the aluminum layer 606. A layer 608 of copper is deposited (e.g., by sputtering) atop the aluminum layer 606, and has a thickness of approximately 5,000 Å. A layer 610 of masking material (e.g., photoresist) is deposited atop the copper layer 608, and has a thickness of approximately 2 mils. The masking layer 610 is processed in any suitable manner to have a plurality (three of many shown) of holes 612 extending through the photoresist layer 610 to the underlying copper layer 608. For example, each hole 612 may be 6 mils in diameter, and the holes 612 may be arranged at a pitch (center-to-center) of 10 mils. The sacrificial substrate 602 has, in this manner, been prepared for fabricating a plurality of multi-layer contact tips within the holes 612, as follows:

A layer 614 of nickel is deposited, such as by plating, onto the copper layer 608, and has a thickness of approximately 1.0–1.5 mils. Optionally, a thin layer (not shown) of a noble metal such as rhodium can be deposited onto the copper layer prior to depositing the nickel. Next, a layer 616 of gold is deposited, such as by plating, onto the nickel 614. The multilayer structure of nickel and aluminum (and, optionally, rhodium) will serve as a fabricated tip structure (620, as shown in FIG. 6B).

Next, as illustrated in FIG. 6B, the photoresist 610 is stripped away (using any suitable solvent), leaving a plurality of fabricated tip structures 620 sitting atop the copper layer 608. Next, the copper (608) is subjected to a quick etch process, thereby exposing the aluminum layer 606. As will be evident, aluminum is useful in subsequent steps since it is substantially non-wettable with respect to solder and braze materials.

It bears mention that it is preferred to pattern the photoresist with additional holes within which "ersatz" tip structures 622 may be fabricated in the same process steps employed to fabricate the tip structures 620. These ersatz tip structures 622 will serve to uniformize the aforementioned plating steps in a manner that is well known and understood, by reducing abrupt gradients (non-uniformities) from manifesting themselves across the surface being plated. Such structures (622) are known in the field of plating as "robbers".

Next, solder or brazing paste ("joining material") 624 is deposited onto the top (as viewed) surfaces of the tip structures 620. (There is no need to deposit the paste onto the tops of the ersatz tip structures 622). This is implemented in any suitable manner, such as with a stainless steel screen or stencil. A typical paste (joining material) 624 would contain gold-tin alloy (in a flux matrix) exhibiting, for example, 1 mil spheres (balls).

The tip structures 620 are now ready to be mounted (e.g., brazed) to ends (tips) of interconnection elements, for example the composite interconnect elements of the present invention. However, it is preferred that the interconnection elements first be specially "prepared" to receive the tip structures 620.

FIG. 6C illustrates a technique 650 for preparing an electronic component 630 with a plurality (two of many shown) of interconnection elements 632 in anticipation of tip structures (620) being mounted to the ends of the interconnection elements 632.

In this example, the electronic component 630 is provided with a plurality (two of many shown) of pillar-like "stand-off" structures 634 extending from its top (as viewed) surface which, as will be evident, will function as polishing "stops". It is not necessary to have a large number of these polishing stops, and they are readily formed with and of the same material as the substrate (e.g., ceramic).

The electronic component 630 is then "cast" with a suitable casting material 636, such as thermally-meltable, solution-soluble polymer, which serves to support the composite interconnection elements 632 extending from the top surface of the space transformer substrate. The top (as viewed) surface of the overmolded substrate is then subjected to polishing, such as with a polishing wheel 638 which is urged down (as viewed) onto the top surface of the casting material. The aforementioned polishing stops 634 determine the final position of the polishing wheel, as indicated by the dashed line labelled "P". In this manner, the tips (top ends, as viewed) of the interconnection elements 632 are polished to be substantially perfectly coplanar with one another.

After having planarized the tips of the interconnection elements, the casting material 636 is removed with a suitable solvent. (The polishing stops 634 may be removed at this time.) Casting materials are well known, as are their solvents. It is within the scope of this invention that casting materials such as wax, which can simply be melted away, can be used to support the interconnection elements (632) for polishing. The electronic component has, in this manner, been prepared to receive the aforementioned tip structures (620) which have been pre-fabricated on the sacrificial substrate (602).

The prepared substrate shown in FIG. 6B is now brought to bear upon the prepared electronic component. As shown in FIG. 6D, the tip structures 620 (only two tip structures are shown in the view of FIG. 6D, for illustrative clarity) are aligned with the tips of the interconnection elements 632, using standard flip-chip techniques (e.g., split prism), and the assembly is passed through a brazing furnace to reflow the joining material 624, thereby joining (e.g., brazing) the prefabricated tip structures 620 to the ends of the interconnection elements 632.

It is within the scope of this invention that this technique can be used to join (e.g., braze) pre-fabricated tip structures to ends of non-resilient interconnection elements, resilient interconnection elements, composite interconnection elements, and the like.

During the reflow process, the exposed aluminum layer (606), being non-wettable, prevents solder (i.e., braze) from flowing between the tip structures 620, i.e., prevents solder bridges from forming between adjacent tip structures. In addition to this anti-wetting function of the aluminum layer, the aluminum layer also serves as a release layer. Using a suitable etchant, the aluminum is preferentially (to the other materials of the assembly) etched away, and the silicon substrate 602 simply "pops" off, resulting in an electronic component having interconnection elements, each having a prefabricated tip structure, as illustrated in FIG. 6E. (Note that the joining material 624 has reflowed as "fillets" 625 on end portions of the interconnection elements 632.) In a final step of the process, the residual copper (608) is etched away, leaving the tip structure 620 with nickel (or rhodium, as discussed hereinabove) exposed for making pressure connections to other electronic components.

It is within the scope of the invention that the brazing (soldering) paste 624 is omitted, and in its stead, a layer of eutectic material (e.g., gold-tin) is plated onto the resilient interconnection elements prior to mounting the contact tips (620) thereto.

By starting with tips of interconnection elements which have been planarized, the tip structures which are affixed to the interconnection elements will also be substantially coplanar with one another. This relaxes constraints upon the formation of interconnection elements which are initially (prior to planarization) substantially coplanar with one another.

Additional Embodiments

It has been described hereinabove how sacrificial substrates can be employed to:

(a) fabricate interconnection elements (such as, but not limited to, composite interconnection elements) for subsequent mounting to electronic components (such as substrates, semiconductor dies, etc.);

(b) prefabricate tip structures upon which interconnection elements can be fabricated for subsequent mounting to electronic components;

(c) prefabricate tip structures for subsequent attachment to tips of elongate interconnection elements (such as, but not limited to, composite interconnection elements) which are already mounted to electronic components.

With regard to fabricating interconnection elements, this permits the interconnection elements to be fabricated and inspected prior to their being mounted to the electronic component, and avoids costly electronic components from being rendered useless by a faulty one of many interconnection elements mounted thereto.

With regard to prefabricating tip structures for the free ends of interconnection elements, this permits tip structures having textures (e.g., surface roughness and shape) specifically adapted to the terminal metallurgy of the electronic component(s) ultimately being contacted by the tips of the interconnection elements to optimize the pressure connections being made therewith.

It should clearly be understood that tip structures fabricated upon sacrificial substrates can be mounted (e.g., brazed or soldered) to any interconnection element, including monolithic spring elements (such as tungsten needles of traditional probe cards) and contact bumps (e.g., of membrane probes). This permits interconnection elements to be provided with tip structures which:

(a) have surface texture for enhancing pressure connections;

(b) may have any suitable metallurgy, including entirely dissimilar from that of the interconnection element; and (c) are readily fabricated to lithographic (i.e., extremely precise) tolerances, especially with respect to inter-tip structure spacing.

With regard to either free-standing interconnection elements fabricated directly upon electronic components, or pre-fabricated upon sacrificial substrates then transferred (e.g., mounted, such as by soldering or brazing) to electronic components, coplanarity of the tips of the free-standing interconnection elements (including prior to mounting discrete pre-fabricated tip structures to the tips (free ends) of the interconnection elements), can be assured by controlling the precision of the fabrication process and/or by polishing the tips of the interconnection elements (see, e.g., FIG. 6C).

FIGS. 7A–7F illustrate a technique 700 for fabricating tip structures which are cantilevers (plated cantilevered beams) and mounting same to terminals of electronic components, and FIGS. 7G–7H illustrate an alternate technique 750 employing such cantilever tip structures. These techniques are particularly well suited to ultimately mounting free-standing interconnection elements to electronic components such as semiconductor devices, space transformer substrates of probe card assemblies, and the like.

FIG. 7A illustrates a sacrificial substrate 702 such as a silicon wafer, into a surface of which a plurality (one of many shown) trenches 704 are etched. The trenches 704 are illustrative of any surface texture 'template' for the tip structures which will be fabricated on the sacrificial substrate 702. The layout (spacing and arrangement) of the trenches 704 can be derived from (replicate) the bond pad layout of a semiconductor die (not shown) which is ultimately (in use) intended to be contacted (e.g., probed) by free-standing interconnection elements to which the tip structures 704 are ultimately attached. For example, the trenches 704 can be arranged in a row, single file, down the center of the sacrificial substrate. Many memory chips, for example, are fabricated with a central row of bond pads.

FIG. 7B illustrates that a hard "field" layer 706 has been deposited upon the surface of the sacrificial substrate 702, including into the trenches 704. Another layer 708, such as of a plateable material, can optionally be deposited over the field layer 706, if the field layer is of a material which is not amenable to plating such as tungsten-silicide, tungsten, or diamond. (If, as will be evident from the discussion hereinbelow, the layer 706 is difficult to remove, it may be applied by selective deposition (e.g., patterning through a mask), to avoid such removal.)

In a next step, illustrated by FIG. 7C, a masking material 710, such as photoresist, is applied to define a plurality of openings for the fabrication of plated cantilever tip structures. The openings in the masking layer 710 extend over the trenches 704. Next, a relatively thick (e.g., 1–3 mils) layer 712 of a spring alloy material (such as nickel and its alloys) is optionally deposited (such as by plating), over which a layer 714 of material is deposited which is amenable to brazing or soldering, in the event that the spring alloy is not easy to bond, solder or braze to. The spring alloy layer 712 is deposited by any suitable means such as plating, sputtering or CVD.

Next, as illustrated by FIGS. 7D and 7E, the masking material 710 is stripped (removed), along with that portion of the layers (706 and 708) which underlies the masking material 710, resulting in a plurality (one of many shown) of cantilever tip structures 720 having been fabricated upon the sacrificial substrate 702. Each cantilever tip structure 720 has an inner end portion 722 (directly over a corresponding one of the trenches 704), an outer end portion 724, and an intermediate portion 726 between and joining the inner and outer end portions 722 and 724.

As is best viewed in FIG. 7E, the cantilever tip structures 720 may be staggered, so that although their inner end portions 722 are all aligned in a row (corresponding, e.g., to a central row of bond pads on a semiconductor device), their outer end portions 724 are opposite one another. In this manner, the spacing between outer end portions 724 are readily caused to be at a greater pitch (spacing) than the inner end portions 722.

Another feature of the cantilever tip structure 704 of the present invention is that the intermediate portion 726 can be tapered, as best viewed in FIG. 7E, from narrowest at the inner end portion 722 to widest at the outer end portion 724. This feature, as will be seen, provides for controllable, determinate amount of deflection of the inner end portion 722 when the outer end portion 724 is rigidly mounted to a terminal of an electronic component such as a space transformer of a probe card assembly.

FIG. 7F illustrates the mounting of the cantilever tip structures 720 fabricated according to the technique 700 of FIGS. 7A–7E to raised interconnection elements 730 extending (e.g., free-standing) from corresponding terminals (one of many shown) 732 of an electronic component 734.

The raised interconnection elements 730 can be any free-standing interconnection elements including, but not limited to, composite interconnection elements, and specifically including contact bumps of probe membranes (in which case the electronic component 734 would be a probe membrane) and tungsten needles of conventional probe cards.

The pre-fabricated cantilever tip structures 720 are mounted by their outer end portions 724 to the tips (top, as shown) of the interconnection elements 730, in any suitable manner such as brazing or soldering. Here, another advantage of the outer end portions being the widest portion of the cantilever tip structure 720 provides a large surface area for performing such soldering or brazing, which is shown by the fillet structure 736.

FIGS. 7G and 7H illustrate another technique 750 of employing cantilever tip structures, wherein the cantilever tip structures are provided with their own raised contacts (interconnection elements) prior to being mounted to terminals of an electronic component. This technique commences with the same steps of forming trenches 704 in a surface of a sacrificial substrate 702, applying a field layer 706, applying an optional brazing layer 708, and applying a masking material 710 with openings defining the locations and shapes of the resulting cantilever tip structures. Compare FIGS. 7A–7C, hereinabove.

In a next step, as illustrated by FIG. 7G, a free-standing interconnection element 752 is mounted to the outer end portion (compare 724) of the inchoate cantilever tip structure 770 (compare 720). Then, a layer of hard (springy) material 754 (compare 712) is deposited over the inchoate cantilever tip structure (and, optionally, another layer such as 714 which is brazeable, see above). The masking layer 710 is stripped, and the plurality (one of many shown) of cantilever tip structures 770 can be mounted to terminals 782 (compare 732) of an electronic component 784 (compare 734), by soldering or brazing the tips of the free-standing interconnection elements 752 to terminals 782, as indicated by the solder fillet 786 (compare 736).

In these examples, the interconnection elements 720 and 770 are illustrated as being composite interconnection elements having spring shapes, but it should clearly be understood that the invention is expressly not limited thereto.

In either case (700, 750) the result is that an electronic component (734, 784) is provided with a plurality of free-standing interconnection elements (730, 752) extending from terminals thereof, the tips (free ends) of the free-standing interconnection elements 720 being provided with tip structures, the inner end portions (722) of which:

(a) are disposed at the end of "cantilevers"; and (b) can readily be provided with a surface texture which is imparted (defined) during the process of fabricating the tip structures on the sacrificial substrate 702.

It is evident from the preceding descriptions that the interconnection elements (730, 752 (i.e., 752 overcoated by 754)) need not be resilient, the ability of the cantilever tip structures (720, 770) to deflect in response to making a pressure connection with another electronic component (not shown) being provided by having the tip structures 704 disposed at the end of cantilever beams. Preferably, the free-standing interconnection elements 720 are much stiffer than the cantilever beams, so that the contact force resulting from a pressure connection can be well defined and controlled.

A distinct feature of this embodiment is that the cantilevers (720 and 770) are tapered, which permits flexure of the cantilever beams to be well-controlled, and to be localized at or near the inner ends of the tip structures.

Moreover, the ability to fabricate the outer ends (724) of the tip structures on a larger scale than the inner ends (722) of the tip structures affords the opportunity to firmly anchor the elongate (raised) interconnection elements (730, 752) to the outer ends of the cantilever tip structures.

In any cantilever beam arrangement, it is preferred that a one end of the cantilever be "fixed" and the other end "movable". In this manner, bending moments are readily calculated. Hence, it is evident that the elongate interconnection elements (730, 752) are preferably as rigid as possible. (In the case of the interconnection elements (730) being contact bumps on a membrane probe, resiliency is provided by the membrane (734), per se.) However, it is not entirely inapposite that the elongate interconnection elements are implemented as composite interconnection elements which will contribute to the overall deflection of the tip structures in response to pressure connections being made to (by) the tip structures.

In the embodiments described hereinabove of forming free-standing interconnection elements (either by themselves, or upon prefabricated tip structures) on sacrificial substrates, the discussion has generally been directed to bonding an end of the interconnection element (or, in the case of a composite interconnection element, bonding an elongate core) to a sacrificial substrate. It is within the scope of this invention that instrumentalities (techniques) other than bonding can be employed.

FIGS. 8A–8C illustrate an alternate embodiment 800 of fabricating free-standing interconnection elements upon a sacrificial substrate, for subsequent mounting to electronic components.

FIG. 8A illustrates an elongate element 802 being fed through a capillary tube 804 of a wirebonding machine (not shown). The elongate element 802 is suitably a wire having a diameter, but may have a non-circular cross-section (e.g., rectangular) and have a thickness. In either case, the end of the elongate element 802 has a region 806 of increased cross-section (e.g., diameter). In the case of a wire elongate element, the region 806 of increased cross-section is readily formed as a ball (sphere) by conventional sparking techniques (e.g., generating a spark to the end of the wire with an electrode). A spark is an electrical discharge.

The end 806 of the elongate element 802 is inserted through a keyhole-shaped opening 808 in a sacrificial substrate 810. The opening 808 has a one portion 812 which is sufficiently large (and appropriately shaped) to permit the bulbous end 806 of the elongate element 802 to pass freely therethrough, as is best viewed in FIG. 8B. The opening 808 has another portion 814 which is sized and shaped to prevent the bulbous end 806 of the elongate element 802 from passing therethrough, and is suitably sized and shaped to have a slight clearance with the elongate element 802. (If the elongate element 802 has sufficient strength, it is acceptable to have a slight interference fit between the element 802 and the portion 814. In which case, a bulbous end (806) may not be required.) In this manner, when the elongate element 802 is moved into the portion 814 (which would typically involve moving the sacrificial substrate relative to the elongate element), as is best viewed in FIG. 8C, it is at least tenuously retained therein (i.e., supported in a predetermined position by the keyhole in the sacrificial substrate. In a next step, the elongate element 802 is severed (for example, using an electrode or mechanical shearing means) so as to be a free-standing element, and to have a free end 816.

Prior to severing, the element 802 may be pulled upward (as viewed) to "lock" the bulbous end 806 in the keyhole portion 814.

In this manner, a plurality of free-standing interconnection elements (or cores for composite interconnection elements) can be mounted in a prescribed spatial relationship with one another on a sacrificial substrate having a corresponding plurality of keyholes. The interconnection elements are readily overcoated (e.g., plated) so as to be composite interconnection elements while they are resident on the sacrificial substrate. Tip structures, such as have been described hereinabove, are readily affixed to the ends (816) of the free-standing interconnection elements.

FIGS. 9A and 9B illustrate yet another technique 900 which is an alternative to bonding the end of the elongate element 902 to a substrate 904 (e.g., a sacrificial substrate). In this case, a relatively rigid elongate element 902, such as may be useful for a monolithic interconnection element is inserted by a mechanism 906 such as the capillary tube of a wirebonder (not shown) into, and optionally through (as shown in FIG. 9B a substrate 904, caused to be free-standing, and severed.

FIG. 9C illustrates yet another technique 950 which is an alternative to bonding the end of the elongate element to a substrate (e.g., a sacrificial substrate). In this case, a relatively rigid elongate element 952 (compare 902), such as may be useful for a monolithic interconnection element is inserted by a mechanism 956 (compare 906) such as the capillary tube of a wirebonder (not shown) into a soft mass 958 on, or in, a surface of a substrate 954 (compare 904), is caused to be free-standing, and severed.

From the descriptions set forth hereinabove, the advantages of fabricating interconnection elements and/or tip structures for same are evident, not the least of which are that tip structures having tightly controlled spacing can lithographically be defined, with "built in" surface texture (topography), with virtually any desired metallization, and applied to the ends of any elongate interconnection elements (including tungsten probe needles) or membrane bump contacts, or the like.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the PARENT CASE.

What is claimed is:

1. A method of an fabricating interconnection element, comprising:

fabricating an interconnection component, including a connection region, fabricating a cantilever structure on a sacrificial substrate;

mounting the cantilever structure to the connection region of the interconnection component; and releasing the cantilever structure from the sacrificial substrate by removing at least a portion of the sacrificial substrate.

2. The method, according to claim 1, characterized in that:
the interconnection component is elongate.

3. The method, according to claim 1, characterized in that:
the interconnection component is a composite interconnection element.

4. The method, according to claim 1, characterized in that:
the interconnection component is a monolithic interconnection element.

5. The method, according to claim 1, characterized in that:
the interconnection component is a contact bump of a membrane probe.

6. The method, according to claim 1, characterized in that:
the cantilever structure has a surface texture.

7. The method, according to claim 1, characterized in that:
the cantilever structure is brazed or soldered to the interconnection component.

8. The method, according to claim 1, characterized in that:
a plurality of cantilever structures are lithographically defined on the sacrificial substrate.

9. The method, according to claim 1, characterized in that:
the interconnection component is an element on a second substrate.

10. The method, according to claim 1, characterized in that:
the cantilever structure is formed by providing a masking layer on the sacrificial substrate, forming an opening in the masking layer, and depositing spring material in the opening.

11. The method, according to claim 1, characterized in that:
the cantilever structure is tapered from a one end to an opposite end thereof.

12. The method, according to claim 1, characterized in that:
the interconnection component is resident on an electronic component.

13. The method, according to claim 1, characterized in that:
the interconnection component is fabricated upon the cantilever structure while the cantilever structure is resident on the sacrificial substrate.

14. The method, according to claim 1, wherein:
the sacrificial substrate comprises a sheet of metal.

15. The method, according to claim 1, wherein:
the sacrificial substrate comprises a silicon wafer.

16. A method of fabricating an elongate interconnection element, comprising:

mounting an elongate interconnection element at a selected area on a surface of a sacrificial substrate; and releasing the elongate interconnection element from the sacrificial substrate by removing at least a portion of the sacrificial substrate.

17. The method, according to claim 16, further comprising:

prior to removing the at least a portion of the sacrificial substrate, attaching a first region of the elongate interconnection element to an electronic component.

18. The method, according to claim 16, further comprising:

prior to mounting the elongate interconnection element, fabricating a cantilever structure at the selected area.

19. The method, according to claim 16, wherein:
the elongate interconnection element is a composite interconnection element.

20. The method, according to claim 16, wherein:
the elongate interconnection element is a monolithic interconnection element.

21. A method of forming a cantilever element, comprising:

providing a support substrate, applying a release material on a first side of the support substrate, the release material suitable for destructive removal, applying a masking material on the first side of the support substrate and masking at least a portion of the release material, patterning the masking material to expose a selected portion through the masking layer, and depositing spring material in the selected portion to form a cantilever element.

22. The method of claim 21 further comprising releasing the cantilever element by removing at least a portion of the release material.

23. The method of claim 21 wherein the support substrate is silicon.

24. The method of claim 21 wherein the support substrate is a portion of a silicon wafer.

25. The method of claim 21 wherein the release material is conductive.

26. The method of claim 21 wherein the release material is aluminum.

27. The method of claim 21 wherein the release material is copper.

28. The method of claim 21 wherein the release material is removed by etching.

29. The method of claim 21 wherein the release material covers the first surface of the support substrate.

30. The method of claim 21 wherein the masking material is photoresist.

31. The method of claim 21 wherein the spring material comprises nickel.

32. The method of claim 21 wherein the spring material comprises cobalt.

33. The method of claim 21 wherein the spring material comprises one or more materials with final material properties and dimensions sufficient to form a resilient member after being released from the support substrate.

34. The method of claim 21 wherein the spring material is deposited by electroplating.

35. The method of claim 21 wherein the spring material is deposited by a method selected from the group consisting of plating, electroless plating, chemical vapor deposition, physical vapor deposition, and sputtering.

36. The method of claim 21 wherein the spring material is deposited to a thickness in the range of about 25 microns to about 75 microns.

37. The method of claim 21 further comprising applying a first compatibility material on the first side of the support substrate, covering at least a portion of the release material.

38. The method of claim 37 further comprising applying the masking material to mask at least a portion of the first compatibility material.

39. The method of claim 38 further comprising patterning the masking material so the selected portion exposes a portion of the first compatibility material.

40. The method of claim 37 wherein the first compatibility material comprises a material which promotes adhesion of the release material and the spring material.

41. The method of claim 37 wherein the first compatibility material comprises a material which forms a more stable interface with one or both of the release material or the spring material as compared to the interface directly between the release material and the spring material.

42. The method of claim 37 wherein the first compatibility material comprises a material which a good electrical contact material.

43. The method of claim 37 wherein the first compatibility material is selected from the group consisting of gold, rhodium, palladium, copper and cobalt.

44. The method of claim 21 further comprising applying a second compatibility material on the first side of the support substrate to cover at least a portion of the spring material.

45. The method of claim 44 wherein the second compatibility material comprises a material to promote connection or the spring material to an interconnection element.

46. The method of claim 44 wherein the second compatibility material comprises a material which forms a more stable interface with one or both of the spring material and the interconnection element.

47. The method of claim 21 further comprising shaping the support substrate to define at least partially a feature on the cantilever element.

48. The method of claim 47 further comprising etching a trench in the support substrate before applying the release material.

49. The method of claim 48 further comprising patterning the masking material so that the trench leads to the formation of a ridge on the cantilever element.

50. The method of claim 49 further comprising patterning the masking material so that the ridge is near an end of the cantilever element.

51. The method of claim 21 further comprising providing an interconnection element, and securing the interconnection element to the cantilever element.

52. The method of claim 51 further comprising securing the interconnection element to a second substrate.

53. The method of claim 51 wherein the interconnection element is a rigid structure with a connection region suitable to be secured to the cantilever element.

54. The method of claim 51 wherein the interconnection element is a post secured to a second substrate.

55. The method of claim 51 wherein the interconnection element is a resilient structure with a connection region suitable to be secured to the cantilever element.

56. The method of claim 51 wherein the interconnection element is a flexible member which is secured to the cantilever element.

57. The method of claim 51 wherein the interconnection element is a flexible member which is secured to the cantilever element and further comprising plating the flexible element so that it becomes a resilient structure.

58. The method of claim 51 wherein the securing comprises brazing.

59. The method of claim 51 wherein the securing comprises soldering.

60. The method of claim 51 wherein the securing comprises reflowing a eutectic material.

* * * * *

(12) EX PARTE REEXAMINATION CERTIFICATE (7750th)
United States Patent
Khandros et al.

(10) Number: US 5,994,152 C1
(45) Certificate Issued: Sep. 21, 2010

(54) FABRICATING INTERCONNECTS AND TIPS USING SACRIFICIAL SUBSTRATES

(75) Inventors: Igor Y. Khandros, Livermore, CA (US); Benjamin N. Eldridge, Danville, CA (US); Gaetan L. Mathieu, Dublin, CA (US)

(73) Assignee: FormFactor, Inc., Livermore, CA (US)

Reexamination Request:
No. 90/009,203, Jun. 27, 2008

Reexamination Certificate for:
Patent No.: 5,994,152
Issued: Nov. 30, 1999
Appl. No.: 08/788,740
Filed: Jan. 24, 1997

Related U.S. Application Data

(60) Continuation of application No. PCT/US96/08107, filed on May 24, 1996, and a continuation-in-part of application No. 08/452,255, filed on May 26, 1995, now Pat. No. 6,336,269, and a continuation-in-part of application No. PCT/US95/14909, filed on Nov. 13, 1995, and a continuation-in-part of application No. 08/570,230, filed on Dec. 11, 1995, now Pat. No. 5,852,871, and a continuation-in-part of application No. 08/457,479, filed on Jun. 1, 1995, and a continuation-in-part of application No. 08/526,246, filed on Sep. 21, 1995, now abandoned, and a continuation-in-part of application No. PCT/US95/14843, filed on Nov. 13, 1995, and a continuation-in-part of application No. 08/533,584, filed on Oct. 18, 1995, now Pat. No. 5,772,451, and a continuation-in-part of application No. PCT/US95/14842, filed on Nov. 13, 1995, and a continuation-in-part of application No. 08/554,902, filed on Nov. 9, 1995, and a continuation-in-part of application No. PCT/US95/14844, filed on Nov. 13, 1995, and a continuation-in-part of application No. 08/558,332, filed on Nov. 15, 1995, now Pat. No. 5,829,128, and a continuation-in-part of application No. PCT/US95/14885, filed on Nov. 15, 1995, and a continuation-in-part of application No. 08/573,945, filed on Dec. 18, 1995, now Pat. No. 5,601,740, and a continuation-in-part of application No. 08/584,981, filed on Jan. 11, 1996, now Pat. No. 5,820,014, and a continuation-in-part of application No. 08/602,179, filed on Feb. 15, 1996, now abandoned, said application No. 08/451,255, said application No. PCT/US95/14909, is a continuation-in-part of application No. 08/340,144, filed on Nov. 15, 1994, which is a continuation-in-part of application No. PCT/US94/13373, filed on Nov. 16, 1994, said application No. 08/340,144, said application No. PCT/US94/13373, is a continuation-in-part of application No. 08/152,812, filed on Nov. 16, 1993, now Pat. No. 5,476,211, said application No. 08/570,230, said application No. 08/457,479, is a division of application No. 08/152,812.

(60) Provisional application No. 60/005,189, filed on May 17, 1996, provisional application No. 60/012,027, filed on Feb. 21, 1996, provisional application No. 60/012,040, filed on Feb. 22, 1996, provisional application No. 60/012,878, filed on Mar. 5, 1996, and provisional application No. 60/013,247, filed on Mar. 11, 1996.

(51) Int. Cl.
*H01L 21/02* (2006.01)
*H01L 21/44* (2006.01)

(52) U.S. Cl. .......................... 438/617; 438/117; 438/15

(58) Field of Classification Search ..................... 438/52
See application file for complete search history.

(56) References Cited

U.S. PATENT DOCUMENTS 3,842,189 A   10/1974   Southgate (Continued)

FOREIGN PATENT DOCUMENTS

| JP | 59-088860 | 5/1984 |
| JP | 6-69294 | 2/1994 |
| JP | 06-084455 | 3/1994 |

OTHER PUBLICATIONS

Wolf, et al. Silicon Processing for the VLSI Era, vol. 1–Process Technology, Lattice Press: Sunset Beach CA, 1986, pp. 508, 535–536.*

(Continued)

*Primary Examiner*—Erik Kielin

(57) ABSTRACT

Interconnection elements and/or tip structures for interconnection elements may first be fabricated upon sacrificial substrates for subsequent mounting to electronic components. In this manner, the electronic components are not 'at risk' during the fabrication process. The sacrificial substrate establishes a predetermined spatial relationship between the interconnection elements which may be composite interconnection elements having a relatively soft elongate element as a cure and a relatively hard (springly material) overcoat. Tip structures fabricated on sacrificial substrates may be provided with a surface texture optimized for mounting to any interconnection elements for making pressure connections to terminals of electronic components. Interconnection elements may be fabricated upon such tip structures, or may first be mounted to the electronic component and the tip structures joined to the free-ends of the interconnection elements. Tip structures formed as cantilever beams are described.

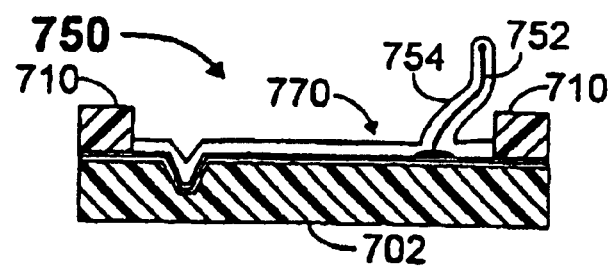
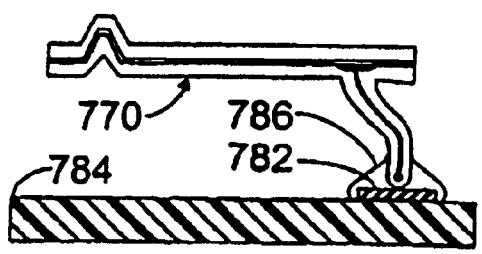

U.S. PATENT DOCUMENTS

| | | |
|---|---|---|
| 4,312,117 A | 1/1982 | Robillard et al. |
| 4,740,410 A | 4/1988 | Muller et al. |
| 4,782,007 A | 11/1988 | Ferrier |
| 4,784,972 A | 11/1988 | Hatada |
| 4,916,002 A | 4/1990 | Carver |
| 4,959,515 A | 9/1990 | Zavracky et al. |
| 4,961,052 A | 10/1990 | Tada et al. |
| 4,995,941 A | 2/1991 | Nelson et al. |
| 5,020,219 A | 6/1991 | Leedy |
| 5,072,288 A * | 12/1991 | MacDonald et al. ........ 257/420 |
| 5,103,557 A | 4/1992 | Leedy |
| 5,148,266 A | 9/1992 | Khandros et al. |
| 5,172,050 A | 12/1992 | Swapp |
| 5,221,415 A | 6/1993 | Albrecht et al. |
| 5,323,035 A | 6/1994 | Leedy |
| 5,371,654 A | 12/1994 | Beaman et al. |
| 5,475,318 A | 12/1995 | Marcus et al. |
| 5,546,375 A | 8/1996 | Shimada et al. |
| 5,596,194 A | 1/1997 | Kubena et al. |
| 5,613,861 A | 3/1997 | Smith et al. |
| 5,994,152 A | 11/1999 | Khandros et al. |
| 2003/0025202 A1 * | 2/2003 | Mikagi et al. ............... 257/737 |

OTHER PUBLICATIONS

"The Resonant Gate Transistor" Harvey C. Nathanson, et al., IEEE Transactions on Electron Devices; vol. Ed–14, No. 3, Mar. 1967.

* cited by examiner

US 5,994,152 C1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 2, 4, 7-12, 15, 21-23, 27-31 and 33-35 are cancelled.

New claims 61-85 are added and determined to be patentable.

Claims 3, 5, 6, 13, 14, 16-20, 24-26, 32 and 36-60 were not reexamined.

61. *A method of fabricating a spring contact interconnection element, comprising:*
   *fabricating an interconnection component, including a connection region,*
   *fabricating a cantilever structure on a sacrificial substrate;*
   *mounting the cantilever structure to the contention region of the interconnection component; and*
   *releasing the cantilever structure from the sacrificial substrate by destructively removing at least a portion of the sacrificial substrate,*
   *wherein the mounting step comprises mounting the cantilever structure to the connection region of the interconnection component such that one end of the cantilever structure is free to move.*

62. *The method, according to claim 61, characterized in that: the interconnection component is elongate.*

63. *The method, according to claim 61, characterized in that: the interconnection component is a monolithic interconnection element.*

64. *The method, according to claim 61, characterized in that: the cantilever structure is brazed or soldered to the interconnection component.*

65. *The method, according to claim 61, characterized in that: a plurality of cantilever structures are lithographically defined on the sacrificial substrate.*

66. *The method, according to claim 61, characterized in that: the interconnection component is an element on a second substrate.*

67. *The method, according to claim 61, characterized in that: the cantilever structure is formed by providing a masking layer on the sacrificial substrate, forming an opening in the masking layer, and depositing spring material in the opening.*

68. *The method, according to claim 61, characterized in that: the cantilever structure is tapered from a one end to an opposite end thereof.*

69. *The method, according to claim 61, characterized in that: the interconnection component is resident on an electronic component.*

70. *The method, according to claim 61, wherein: the sacrificial substrate comprises a silicon wafer.*

71. *The method of claim 61, wherein the cantilever structure, the interconnection component, and the connection region are electrically conductive.*

72. *A method of forming a cantilever element, comprising:*
   *providing a support substrate,*
   *applying a release material on a first side of the support substrate, the release material suitable for destructive removal,*
   *applying a masking material on the first side of the support substrate and masking at least a portion of the release material,*
   *patterning the masking material to expose a selected portion through the masking layer,*
   *depositing spring material in the selected portion to form a cantilever element, and*
   *completely releasing the cantilever element from the support substrate.*

73. *The method of claim 72 wherein the spring material comprises one or more materials with final material properties and dimensions sufficient to form a resilient member after being released from the support substrate.*

74. *The method of claim 72 wherein the spring material is deposited by electroplating.*

75. *The method of claim 72 wherein the spring material is deposited by a method selected from the group consisting of plating, electroless plating, chemical vapor deposition, physical vapor deposition, and sputtering.*

76. *The method of claim 72, comprising releasing the cantilever element by removing at least a portion of the release material.*

77. *The method of claim 76, comprising forming the cantilever element for effecting pressure connections between electronic components.*

78. *The method of claim 72, comprising forming the cantilever element for effecting pressure connections between electronic components.*

79. *The method of claim 72 further comprising releasing the cantilever element by removing at least a portion of the release material.*

80. *The method of claim 72 wherein the support substrate is silicon.*

81. *The method of claim 72 wherein the release material is copper.*

82. *The method of claim 72 wherein the release material is removed by etching.*

83. *The method of claim 72 wherein the release material covers the first surface of the support substrate.*

84. *The method of claim 72 wherein the masking material is photoresist.*

85. *The method of claim 72 wherein the spring material comprises nickel.*

* * * * *